United States Patent [19]

Garber et al.

[11] Patent Number: 5,617,552

[45] Date of Patent: Apr. 1, 1997

[54] LOSSLESS DATA COMPRESSION SYSTEM AND METHOD

[75] Inventors: Jonathan F. Garber, Woodside; Jorg A. Brown, Concord; Chad P. Walters, Palo Alto, all of Calif.

[73] Assignee: Connectix Corporation, San Mateo, Calif.

[21] Appl. No.: 613,433

[22] Filed: Feb. 29, 1996

Related U.S. Application Data

[63] Continuation of Ser. No. 175,749, Dec. 30, 1993, abandoned.

[51] Int. Cl.$^6$ ............... G06F 9/26; G06F 9/34; G06F 12/00; G06F 12/02
[52] U.S. Cl. ............ 395/401; 395/402; 395/427; 395/114; 341/51; 341/55; 341/60
[58] Field of Search .................. 395/401, 402, 395/427; 341/51, 55, 60; 345/202; 364/260.6, DIG. 1

[56] References Cited

U.S. PATENT DOCUMENTS

| | | | |
|---|---|---|---|
| 4,464,650 | 8/1984 | Eastman et al. | 341/51 |
| 4,558,302 | 12/1985 | Welch | 341/51 |
| 4,814,746 | 3/1989 | Miller et al. | 341/95 |
| 4,989,134 | 1/1991 | Shaw | 395/600 |
| 5,063,499 | 10/1991 | Garber | 395/500 |
| 5,150,119 | 9/1992 | Yoshida et al. | 341/51 |
| 5,153,591 | 10/1992 | Clark | 341/51 |
| 5,237,460 | 8/1993 | Miller et al. | 360/8 |
| 5,374,916 | 12/1994 | Chu | 340/146.2 |
| 5,379,036 | 1/1995 | Storer | 341/51 |

*Primary Examiner*—Jack A. Lane
*Assistant Examiner*—Than V. Nguyen
*Attorney, Agent, or Firm*—Gary S. Williams; Flehr, Hohbach, Test, Albritton & Herbert

[57] ABSTRACT

A lossless data compression system and method compresses a set of M data words stored in a computer memory. A first table stores data representing last occurrence positions among those of the M data words already processed for all distinct word values. A second table stores for each data word an entry indicating the position, if any, of a most recent prior occurrence of another data word with the same word value. A dictionary index indicates how many distinct data word values have been encountered during processing of M data words. The M data words are processed in in said M data words previously processed, identifying a longest sequence of data words starting with said each data word referencing said second table to identify data words earlier in said M data words than said each data word that match said each data word's value, identifying a longest sequence of data words earlier in said M data words than said data word which match an equal number of data words starting with said each data word, (B1) when said longest sequence's length is greater than one data word, outputting a run length code that indicates said longest sequence's length and position, and updating said first and second tables for the equal number of data words starting said each data word, and (B2) when said longest sequence's length is equal to one data word, outputting a code that indicates the position of said identified longest sequence, and updating said first and second tables for said each data word.

13 Claims, 11 Drawing Sheets

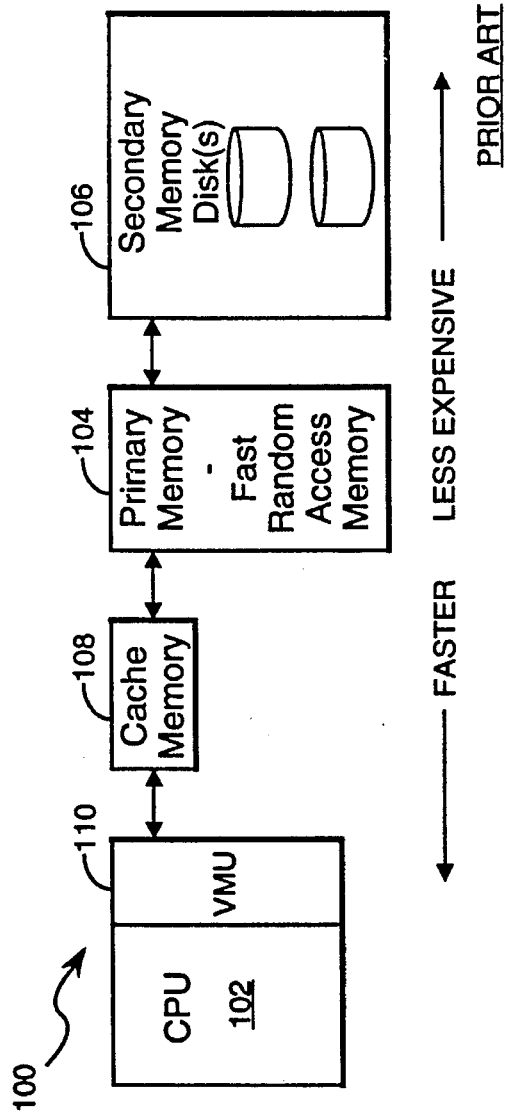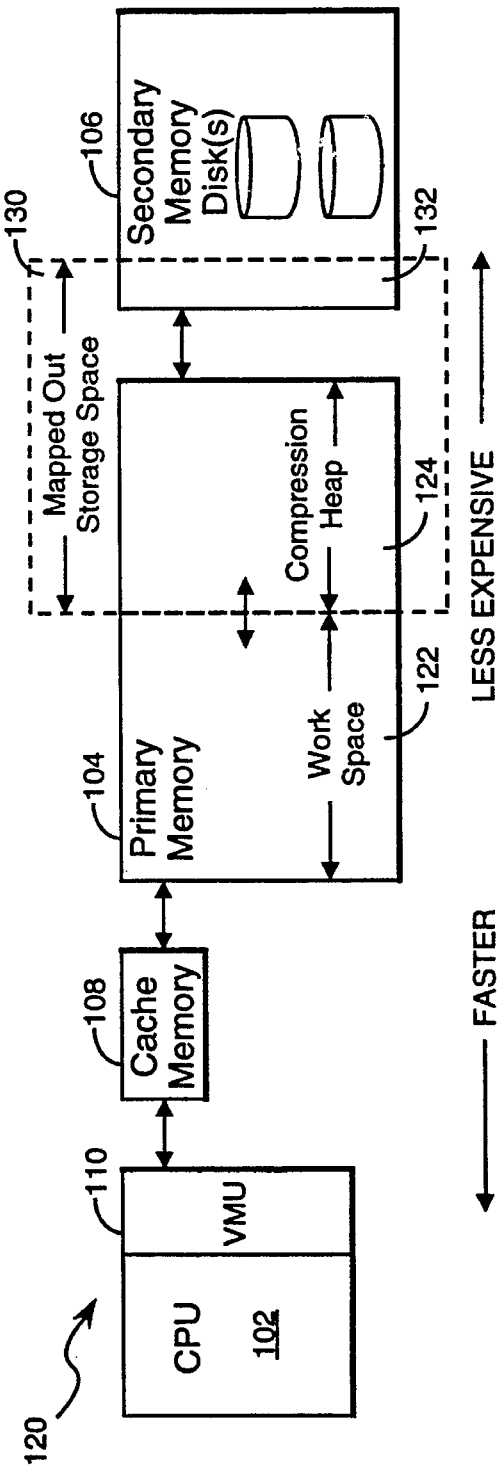

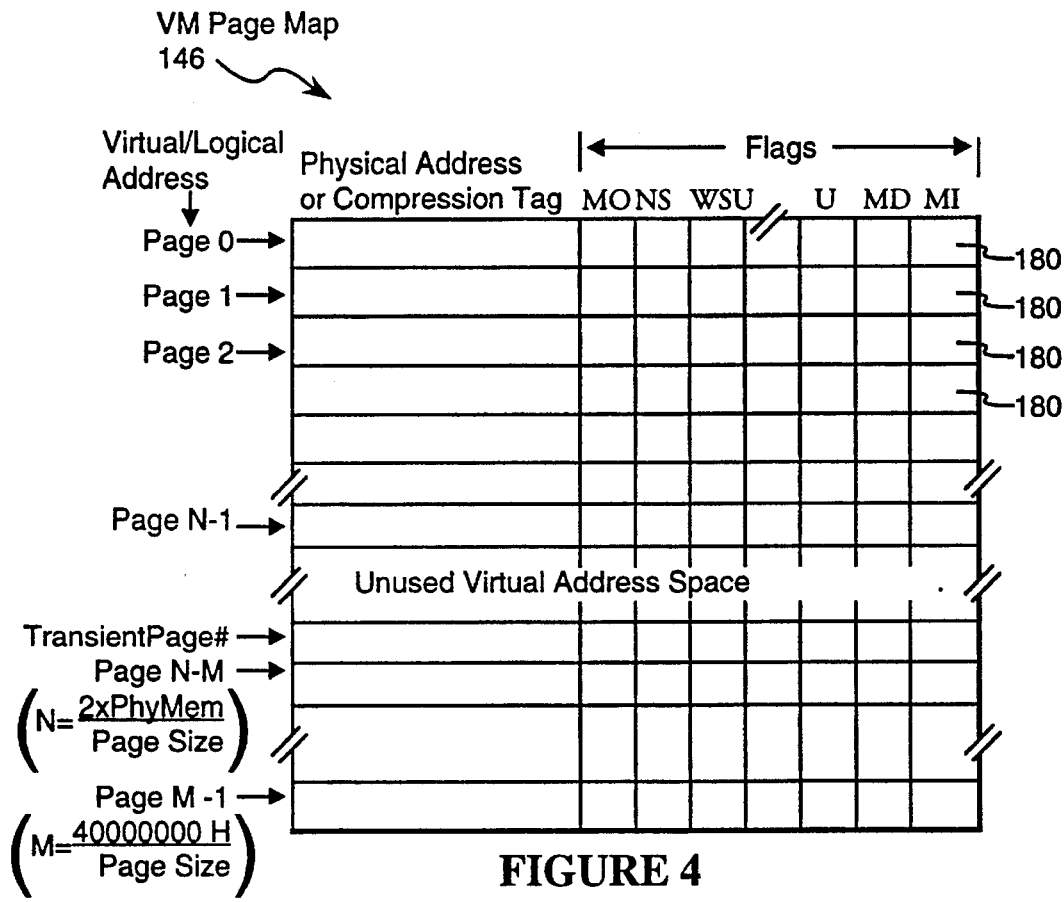

FIGURE 4

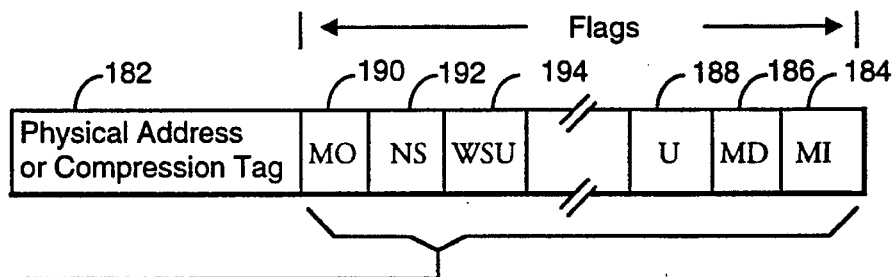

MI = 1 if Page is Mapped Into Uncompressed Primary Memory
     0 otherwise (e.g., Unused, Compressed, etc.)

MD = 1 if Page has been modified (written to) since it was last allocated a page in Primary Memory
     0 otherwise (e.g., Page has not be modified)

MO = 1 if Page is Mapped Out of the Work Space
     0 otherwise (e.g., Mapped In or Unused)

NS = 1 if Page cannot be Swapped Out of the Work Space
     0 otherwise (e.g., Page can be swapped out)

U =  1 if Page Used since last time Used Flags were cleared
     0 if Page Not Used Since Used Flags were cleared WSU= 1 if Page Used in Current Usage Epoch
     0 if Page Not Used in Current Usage Epoch

FIGURE 5

VM Manager
150

Executable VM Manager Code

| | |
|---|---|
| Initialize - VM Manager Initialization Procedure | 216 |
| ReceiveFault - Procedure for responding to VMU Page Fault | 200 |
| GetPage() - Procedure for getting RAM page to use | 202 |
| MapPage - Procedure for mapping RAM page into fault page | 203 |
| SwapOutPage() - Procedure for swapping out a RAM page | 204 |
| AgingEvent - LRU Procedure for Selecting Pages to Swap Out | 206 |
| BuildBest128List | 208 |
| Read Pending Procedure | 210 |
| DeallocateSpace Procedures | 212 |
| ElapsedEpochTimer - Timer Procedure | 214 |

⋮

VM Manager Data

| | |
|---|---|
| Best128List | 222 |
| LRU - Page Usage Data Table | 220 |
| #VMPages (2xPhysical RAM Pages)<br>#PagesUsed<br>#Uncompressed Pages (excluding Unswappable Pages)<br>GrowWS Flag<br><br>StartTime<br>ElapsedEpochTime<br>EpochThreshold<br><br>SwapThreshold<br>#Swaps<br>StartSweepPtr<br>XP<br>BestAge<br>#BestEntries<br><br>Page#<br>PG<br>LA<br>fail<br>Flag1<br>Flag2 | 224 |

FIGURE 6

Compression Manager 152

Executable Compression Manager Code

| | |
|---|---|
| GetCompPage() - Send Free Page to VM Manager | ← 250 |
| FillFromBottom | ← 252 |
| WriteCompPage - Store Page in Compressed Store | ← 254 |
| ReadCompPage - Retreive and Decompress Page from Compressed Store | ← 256 |
| ReleaseCompPage - Release Page in Compressed Store | ← 258 |
| RemoveFromMapChain | ← 260 |
| Compress - Compress one page | ← 262 |
| Decompress - Decompress one page | ← 264 |

⋮

Compression Manager Data
  PtrToDiskMap - Ptr to sector table
  PtrFreeSector
  PtrMapChain
  PtrCompWorkSpace
  PtrCompBuffer
  PtrMainMap
  FreeMapEntry
  PtrEndMap FirstFree - Ptr to First Free Space Block in Heap
  LastFree - Ptr to Last Free Space Block in Heap
  EndHeap - Ptr to end of Heap
  FreeHeapBytes - number of free bytes in the Heap
  NextCompHeapPage - logical page # for next page to be added to heap
  MapChainStart - beginning of MapChain
  MapChainEnd - end of Map Chain
  GrowWS
  SwapOutFlag Word
  Flag3
  Flag4
  Page#
  PG
  fail

FIGURE 9

| FIGURE 16A |
| --- |
| FIGURE 16B |

LOSSLESS DATA COMPRESSION SYSTEM AND METHOD

This is a continuation of application Ser. No. 08/175,749 filed Dec. 30, 1993, now abandoned.

A portion of the disclosure of this patent document contains materials to which a claim of copyright protection is made. The copyright owner has no objection to the facsimile reproduction by anyone of the patent document or the patent disclosure, but reserves all other rights whatsoever.

The present invention relates generally to virtual memory management systems and methods, and particularly to a system and method for improving the performance of a virtual memory management system by utilizing part of a computer system's high speed random access memory (RAM) to store "swapped out" pages in compressed form.

BACKGROUND OF THE INVENTION

In most computers having virtual memory management, the available address space for the computer's operating system and application processes exceeds the amount of physical RAM available. As shown in FIG. 1, a computer system 100 will typically have a central processing unit (CPU) 102, such as a Motorola 68040 or Intel 80486, a primary memory 104 (typically random access memory (RAM)), a secondary memory 106 (typically one more magnetic or optical disks), and a cache memory 108 for storing a copy of the memory locations most recently addressed by the CPU 102. The cache memory 108, or a portion of the cache memory, is often fabricated as part of the same integrated circuit as the CPU 102.

As indicated in FIG. 1, the CPU 102 is typically the fastest of the components in the computer system, followed by the cache memory 108, the primary memory 104 and finally the secondary memory 106. Also shown in FIG. 1 is a virtual memory unit (VMU) 110, which is often fabricated as part of the same integrated circuit as the CPU 102.

Conventional Virtual Memory Management

The following is a brief explanation, for those readers not skilled in the art, of how conventional virtual memory management works. The virtual memory unit 110 enables programs executed by the CPU 102 to utilize an address space that is larger than the actual storage capacity of the primary memory 104. For instance, a computer with 8 MBytes (MegaBytes) of RAM might utilize a virtual address space of 16 MBytes, or even more. The VMU 110 uses a "page table" (discussed in more detail below) to store one "page table entry" for each virtual memory page in the computer's virtual memory address space. One version of a page table is shown in FIG. 4 (although that page table contains features particular to the present invention).

Each page table entry includes an address value and status flags indicating whether the corresponding virtual memory page is stored in primary or secondary memory. Thus, the status flags in a page table entry indicate whether the address value in that entry corresponds to a primary memory location or a secondary memory location. For a computer system using pages that are 4 KBytes (KiloBytes) in size, a 16 MBytes virtual address space would occupy 4096 pages, and thus the page table would contain 4096 page table entries.

Since the CPU uses virtual addresses for its internal address computations, the virtual memory unit 110 translates each CPU specified virtual memory address values into a primary memory address value when the status flags in the corresponding page table entry indicates that the CPU specified address is currently stored in the primary memory 104. The translated address signal generated by the virtual memory unit 110 is then used to address the primary memory 104. When the CPU specified virtual memory address value is not currently stored in the primary memory 104, the page table entry accessed by the virtual memory unit will have a status flag indicating that fact, which causes the virtual memory unit to generate a "fault signal". The fault signal indicates the virtual page in which the fault occurred and also indicates, either directly or indirectly, the values stored in the address and flag fields of the corresponding page table entry.

Whenever a virtual memory fault occurs, a software procedure, typically called a virtual memory manager, locates a page of primary memory that can be mapped into the virtual memory page in which the fault occurs. If the virtual page upon which the fault occurred was previously swapped out to secondary memory, the contents of the virtual memory page are copied into the page of primary memory. The virtual memory manager then updates the page table entry for the virtual page to indicate the physical primary memory page in which the virtual memory page is now located, and then signals the virtual memory unit 110 to resume operation. Upon resuming operation, the virtual memory unit 110 again accesses the page table entry for the CPU specified virtual memory address, and this time successfully translates the virtual memory address into a primary memory address.

While there are many other aspects of virtual memory management not discussed here, the salient point here is that in standard virtual memory management subsystems, at any one point in time a virtual memory page is either in primary memory or secondary memory, or possibly in transition from one to the other.

Basis for Present Invention

During the period from 1983 through 1993, CPU operating speeds have increased much more dramatically than disk memory and other secondary memory operating speeds. As a result, the "penalty" (on a computer system's operating speed) associated with the use of virtual memory has actually been getting worse, in that using a fast CPU causes more CPU cycles to be wasted when waiting for a page of virtual memory to be swapped in from secondary memory to primary memory.

Consider for a moment the relative speeds of (A) swapping a page out to disk (i.e., the prior art) and (B) compressing a page of 4096 bytes and storing it in a RAM heap for compressed pages (i.e., the present invention). Each disk access, almost regardless of the page size, takes an average of 9 to 20 milliseconds, depending on the disk's operating speed. We will assume the use of a moderately fast disk with a 10 millisecond access time. Tests of the data compression and decompression procedures used in the preferred embodiment indicate that a page of 2048 16-bit (2-byte) words (i.e., 4 KBytes) is compressed, on average, in 8 milliseconds, and is decompressed, on average, in about 2.3 milliseconds using a 25 MHz Motorola 68040. When using a 50 MHz Motorola 68030, the average compression and decompression execution times for a page are 12 milliseconds and 3.5 milliseconds, respectively.

As indicated above, data decompression is much faster than data compression. Thus, decompressing a compressed page takes much less time than recovering a swapped out page from disk (typically less than 25% as much time).

Another basis for the present invention is the observation that the contents of primary memory (i.e., RAM) in most computer systems is much more compressible than the average disk file. In particular, the inventors of the present invention have observed that the contents of the swappable pages in RAM are typically compressible by a factor of three using standard Lempel-Zif data compression techniques and garbage collection of deallocated memory address ranges, while the contents of disk files are typically compressible by only a factor of 2 to 2.2 using standard Lempel-Zif data compression techniques. Given an average compression ratio of 3:1, consider the following: if half (e.g., 4 MBytes) of a computers 8-MByte RAM is used for normal memory access, and the second half of RAM (4 MBytes) is used to store compressed pages, then the total data content of RAM will be (4 MBytes+12 MBytes=16 MBytes), on average, twice the RAM's normal storage capacity.

Thus, using the present invention, it is possible to have a virtual memory address space that is twice the size of the computer's primary memory without having to swap any pages out to disk.

Of course, the contents of RAM are not always of average compressibility, and thus it may be necessary at times to swap some pages out to disk. However, as noted above, decompressing a page generally takes less than 25% as much time as a disk access, and thus even if a compressed page is swapped out to disk, the use of data compression slows the recovery of that particular page by only about 25%. Furthermore, in normal usage less than 20% of pages removed from the "work space" will be swapped out to disk, and thus, on average, the time for recovering from page faults is substantially reduced. (Actually, in most cases, no pages will be swapped out to disk, with 20% representing the normal upper limit.) As shown by the following computation:

$$0.80 \text{ (percentage of pages)} \times 0.25 \text{ (relative speed of access)} + 0.20 \times 1.25 = 0.20 + 0.25 = 0.45$$

the average page fault response time is reduced by about 50% using the present invention with a CPU of only very average capability, while using less disk space than standard virtual memory subsystems. When using a CPU at least as powerful as a 40 MHz 68040 or a 66 MHz 80486DX-2 microprocessor, the average page fault response time is reduced by 60% or more, with correspondingly better performance for even faster processors.

Another motivation for the present invention is that hard disk use is very power consuming for portable computers. Normally, using virtual memory on a portable computer would mean that the hard disk would be in almost constant use, thereby draining the computer's battery. Use of the present invention allows the use of virtual memory while eliminating or substantially reducing the power usage associated with swapping pages to and from hard disk.

The present invention is generally applicable to any computer system having a virtual memory unit and a CPU at least as powerful as a Motorola 68030 or an Intel 80386 running at 25 Megahertz. In such computer systems, use of the present invention will reduce the latencies associated with the use of virtual memory and thus will improve overall system performance. In addition, the present invention will enable many computer users to avoid the purchase of additional random access memory since the "penalty" associated with using virtual memory instead of physical random access memory will be reduced.

SUMMARY OF THE INVENTION

In summary, the present invention is a virtual memory system and method for enabling a computer system to use a virtual memory address space that is larger than the size of physical primary memory while swapping few, if any, pages out to secondary memory. The computer's primary memory is divided into a work space, used for storing uncompressed pages that are in current use by the computer system's operating system and applications, and a "Compression Heap". A MappedOut storage space, which includes the Compression Heap and a portion of the computers secondary memory, is used to store all pages swapped out of the work space.

A virtual memory manager dynamically determines the number of pages of primary memory which need to be included in the work space, and moves pages of primary memory into the work space from the compression heap as needed. Virtual pages are selected to be swapped out of the work space to MappedOut storage on the basis of memory usage data. The virtual memory manager includes logic for preferentially compressing and storing swapped out virtual memory pages in the Compression Heap (in primary memory) so long as the MappedOut storage space includes a sufficient number of pages of primary memory to store those virtual memory pages, and for storing ones of the swapped out virtual memory pages in secondary memory when insufficient space is available in the Compression Heap. Thus, the size of the work space is variable and the proportion of swapped pages stored in primary memory and in secondary memory are also variable.

A page table stores a page table entry corresponding to each virtual memory page. Each page table entry specifies a tag value, corresponding to a location in the primary or secondary memory, and a plurality of status flags for indicating the status of the corresponding virtual memory page. The status flags includes a MappedIn flag having a True/False value that indicates when the tag value corresponds to a RAM page (in the active work space) in which the corresponding virtual memory page is stored.

A virtual memory unit (VMU) translates CPU specified virtual memory address values into primary physical address values when the MappedIn flag in the page table entries corresponding to the CPU specified virtual memory address values are True. The VMU generates fault signals when the MappedIn flag in the page table entries corresponding to the CPU specified virtual memory address values are False. The virtual memory manager responds to each fault signal from the VMU by updating the page table entry corresponding to the CPU specified virtual memory address value which caused the fault signal, so that the page table entry specifies a primary memory page and a MappedIn flag having a True value. The virtual memory manager includes a work space manager that defines a work space and a MappedOut storage space for storing virtual memory pages. The work space is located in a first portion of the primary memory. The MappedOut storage space is located in a second portion of the primary memory pages and in a portion of the secondary memory.

A memory usage monitor stores memory usage data. The virtual memory manager includes swap out selection logic that selects, on the basis of the memory usage data, virtual memory pages to be swapped out from the work space to the MappedOut storage space. A MappedOut storage manager receives from the virtual memory manager the virtual memory pages selected to be swapped out, stores the received virtual memory pages in the MappedOut storage space, and adds the primary memory pages in which the received virtual memory pages were stored to the Mapped-Out storage space.

The MappedOut storage manager includes a data compressor that compresses at least some of the received virtual memory pages prior to their storage in the MappedOut storage space, and a data decompressor that decompresses the compressed virtual memory pages when the virtual memory manager responds to fault signals caused by VMU faults on the compressed virtual memory pages.

BRIEF DESCRIPTION OF THE DRAWINGS

Additional objects and features of the invention will be more readily apparent from the following detailed description and appended claims when taken in conjunction with the drawings, in which:

FIG. 1 is a block diagram of the memory hierarchy in a conventional computer system.

FIG. 2 is a block diagram showing the memory hierarchy in a computer system using the present invention.

FIG. 4 is a block diagram of a page table (also herein called a page map) for a computer system using the present invention.

FIG. 5 is a diagrammatic representation of one page table entry in the page table of FIG. 4.

FIG. 6 is a diagrammatic representation of the virtual memory manager used in a preferred embodiment of the present invention.

FIG. 9 is a diagrammatic representation of the Compression Manager used in a preferred embodiment of the present invention.

DESCRIPTION OF THE PREFERRED EMBODIMENTS

Figure 3:
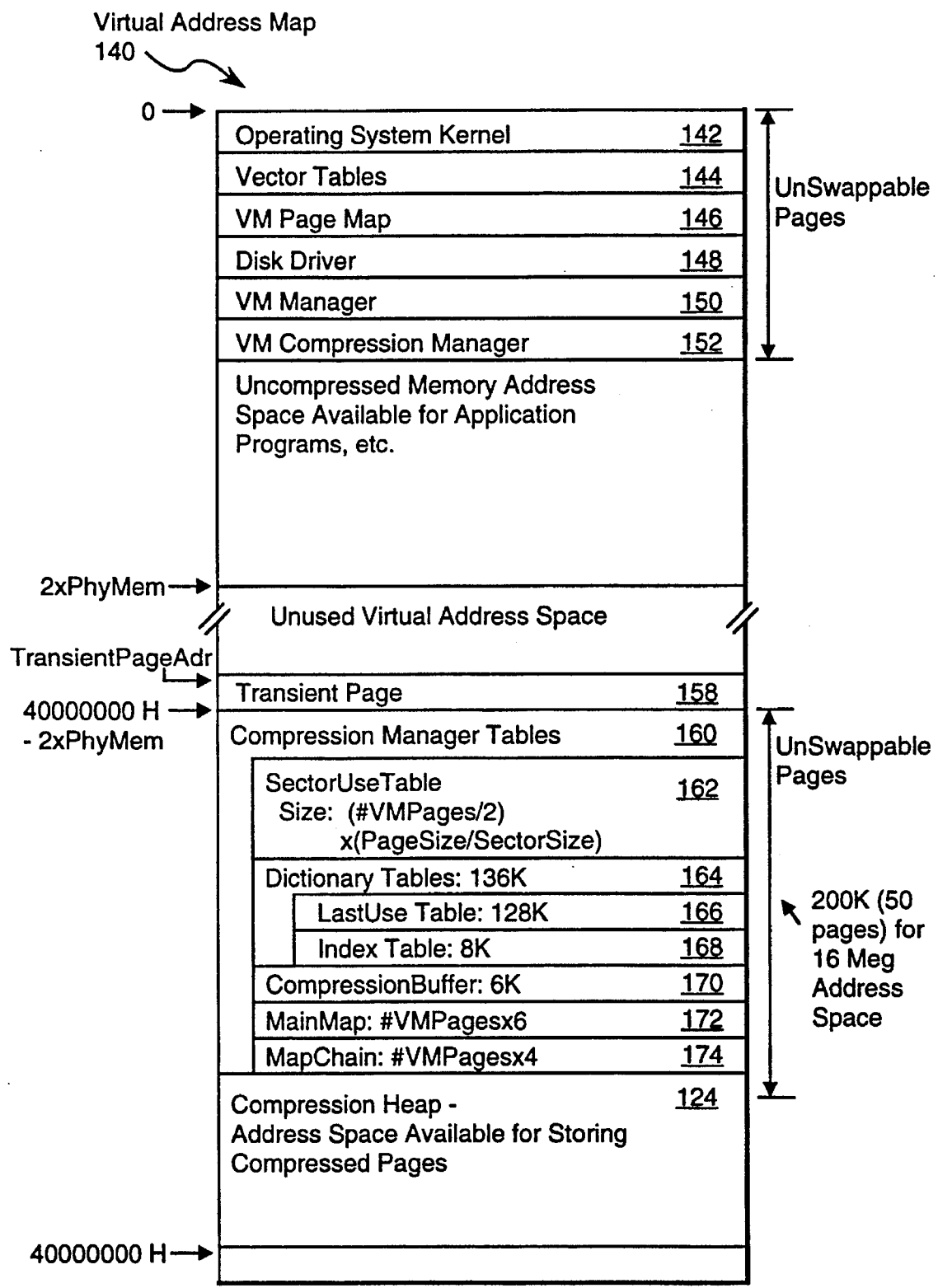
FIG. 3 schematically represents a typical virtual memory address map for a computer system using the present invention.
Figure 7:
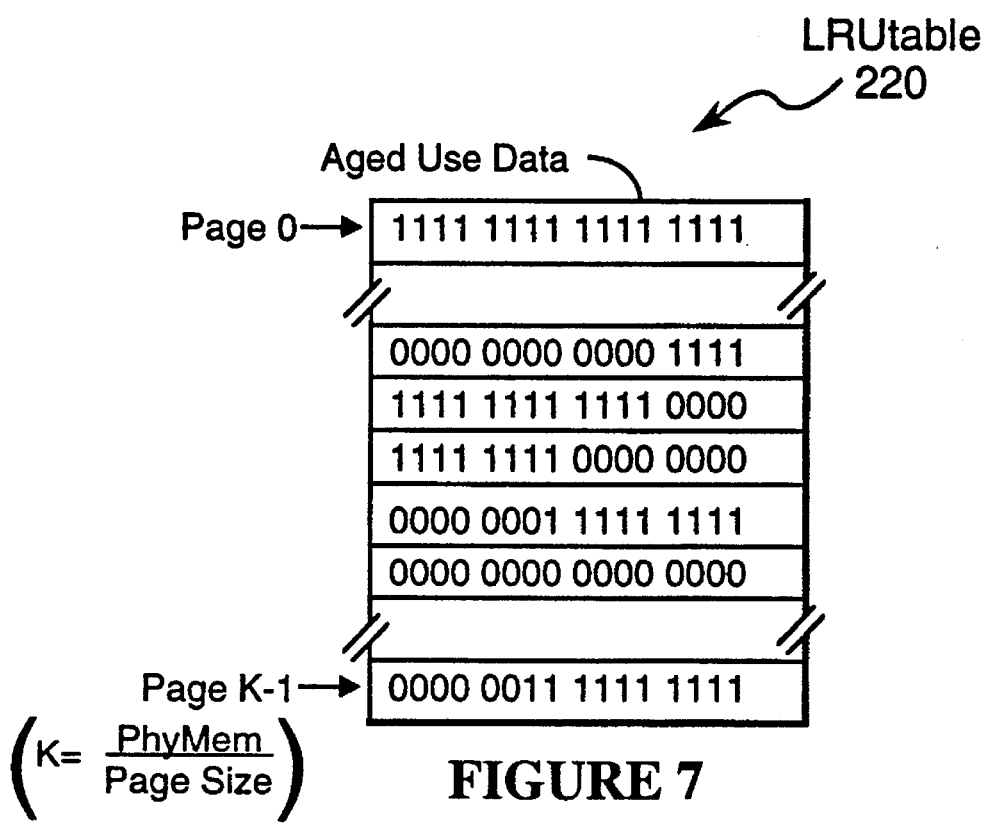
FIG. 7 is a diagrammatic representation of a memory usage table that stores data indicating which virtual memory pages in a defined virtual memory address space were least recently used.
Figure 8:
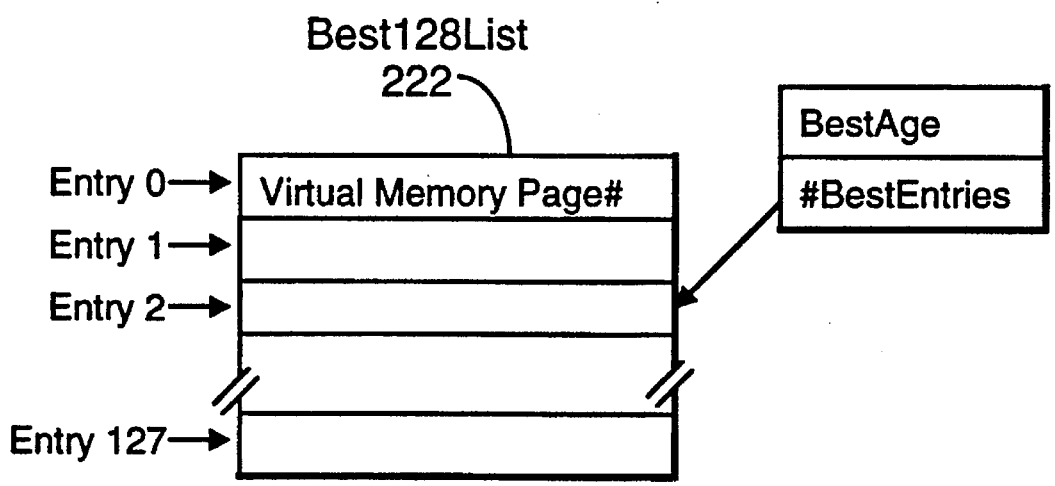
FIG. 8 is a diagrammatic representation of a table used in a preferred embodiment of the present invention to store data representing a list of "best"pages to swap out from the computer's work space if it becomes necessary to swap pages out of the work space.

Tables 1–16 at the end of the specification contain pseudocode representations of software procedures relevant to the present invention. The pseudocode used in these appendices is, essentially, a computer language using universal computer language conventions. While the pseudocode employed hem has been invented solely for the purposes of this description, it is designed to be easily understandable by any computer programmer skilled in the art. The computer programs in the preferred embodiment are written in the assembly language used for Motorola 680×0 microprocessors.

Referring to FIG. 2, a computer system 120 in accordance with the present invention includes a central processing unit (CPU) 102, such as a Motorola 68040 or Intel 80486, a primary memory 104 (typically random access memory (RAM)), a secondary memory 106 (typically one more magnetic or optical disks), and a cache memory 108 for storing a copy of the memory locations most recently addressed by the CPU 102.

Solely for the purposes of describing a preferred embodiment, it will be assumed that the CPU is a Motorola 68040 running at 33 Megahertz, that the primary memory 104 contains 8 MBytes of RAM, and that the secondary memory 106 is a fast hard disk having a capacity of over 100 MBytes. Furthermore, it will be assumed that the computer system 120 used in the preferred embodiment is a Macintosh computer, produced by Apple Computer Corporation, running the Macintosh 7.1 operating system. It should be understood that this system configuration is not part of the present invention, but rather is simply one example of a context in which the present invention can be used.

As shown in FIG. 2, the primary memory 104 is divided into two portions: a Work Space 122 and a Compression Heap 124. A MappedOut storage space 130, which includes the Compression Heap 124 and a portion 132 of secondary memory, is used to store all pages swapped out of the work space. The portions of primary memory allocated to the Work Space 122 and Compression Heap are variable, as will be explained below, and thus these portions of primary memory may not have fixed sizes.

In a preferred embodiment using a virtual address space that is precisely twice the size of the physical primary memory, the portion 132 of secondary memory 106 that is included in the MappedOut storage space is equal in size to the physical primary memory. Thus, in the preferred embodiment, for a computer system with 8 MBytes of RAM, the virtual memory address space will be 16 MBytes and the portion 132 of secondary memory included in the MappedOut storage space will be 8 MBytes.

Virtual Memory Address Map and VM Page Table

FIG. 3 shows a map 140 of the virtual address space in a computer using the present invention. The lowest addresses (i.e., near address zero) in the virtual address space are typically occupied by items that must always be present in primary memory:

the operating system's kernel 142, interrupt vector tables 144, the Page Table 146 (herein also called the Page Map) used by the virtual memory unit 110 to map virtual memory addresses into physical memory addresses, a disk driver 148, needed for sending pages of virtual memory to and from disk, and a virtual memory manager 150, for responding to virtual memory unit fault signals.

To that "standard" set of unswappable items, the present invention adds a virtual memory Compression Manager 152, which can be though of as part of the virtual memory manager. In the preferred embodiment, however, the VM Compression Manager 152 is a layer of software that is called by the VM Manager 150.

As shown in FIG. 3, a first portion of the virtual memory address space extends to an address that is twice as large as the physical RAM. Note that the variable "PhyMem" is equal to the size of the physical RAM, in units of bytes and that "2×PhyMem" therefore means a value equal to twice the size of the physical RAM. This first portion of the virtual memory address space is used in the same way that conventional virtual memory is used: to store programs and data that can be directly addressed by programs executed by the CPU.

The Work Space 122 comprises the unswappable items discussed above, plus all other pages of the "regular" virtual memory address space which are uncompressed and resident in primary memory.

A second portion of the virtual memory address space, located between virtual memory addresss "40 000 000 H−2×2×PhyMem" and 40 000 000H (1 Gigabyte), is used by the VM Compression Manager 152 to store (A) a set of Compression Manager Tables 160 that are used to keep track of virtual memory pages stored in the MappedOut storage space 130, and (B) the Compression Heap 124. Thus, the Compression Heap 124 is assigned to a portion of the virtual address space that is not directly addressable by ordinary programs executed by the CPU.

One page of virtual address space, just below the Compression Manager Tables 160 (but which could be located in any other page of unused virtual memory address space), is herein called the Transient Page 158. Whenever a physical RAM page is about to be mapped into a specified virtual memory address, in response to a page fault, the page is first mapped into the address of the Transient Page. That address is herein labeled the TransientPageAdr. The page is then usually filled with zeros, or with the previous contents of the virtual page, and then the page is mapped into the specified virtual memory address for satisfying the page fault.

The amount of virtual memory address space assigned to the Compression Manager Tables 160 depends on the maximum number of virtual memory pages that can be in used, excluding virtual memory pages used by the Compression Manager Tables 160 and the Compression Heap 124. In the preferred embodiment it is assumed that the virtual memory address space useable by operating system and application programs (i.e., all programs excluding the VM Manager and VM Compression Manager) will not exceed twice the physical primary memory.

As will be described in more detail below, the Compression Manager Tables 160 include a Sector Table 162, Dictionary Tables 164 (including a LastUse table 166 and Index Table 168) having a fixed size of 136 KBytes, a Compression Buffer 170 of 6 KBytes, a Main Map table 172 and a Map Chain table 174. For a computer having 8 MBytes of physical RAM and 4-KByte pages, the available virtual address space is 4K pages, the Sector Table Occupies 16 KBytes, the Main Map table 172 occupies 24 KBytes and the Map Chain table 174 occupies 16 KBytes, and thus the Compression Manager Tables 160 occupy a total of 192 KBytes (48 pages). The 48 pages in which the Compression Manager Tables 160 are stored, plus the first two pages assigned to the lowest addresses of the Compression Heap 124, are unswappable pages that must be kept in primary memory at all times.

FIG. 4 shows the virtual memory Page Table 146 used by the virtual memory unit VMU 110 (see FIG. 2) to translate virtual addresses into physical memory addresses. The Page Table 146 is stored in RAM and includes one Page Table Entry (PTE) 180 for each defined virtual memory page. The Page Table is indexed by the most significant bits of the virtual memory address, as determined by the page size. For a computer using 32-bit addresses and 4-KByte pages, the Page Table will be indexed by the 20 most significant bits of each virtual memory address. Thus, when the CPU tries to access any specified virtual memory address, the VMU will use the 20 most significant bits of that address to access a PTE in the Page Table. That 20-bit value is called the page number.

In the preferred embodiment each Page Table Entry 180 occupies 4 bytes and includes 20-bit Tag Value 182 and 12 status flags, only six of which are discussed herein. The 20-bit Tag Value 182 is equal to the 20 most significant bits of a physical address when the corresponding virtual memory page is mapped into a page of RAM in the Work Space. Otherwise, the 20-bit Tag Value 182 is either a Tag Value used by the VM Compression Manager 152 to keep track of where the virtual memory page is located in the MappedOut storage space 130, or is a void value having no significance (e.g., if the virtual memory page is currently unassigned to any program or task).

FIG. 5 represents a single Page Table Entry 180. The six status flags relevant to the present invention are as follows. The MappedIn (MI) flag 184 is set equal to 1 when a virtual memory page is mapped into the Work Space (the uncompressed part of primary memory) and set equal to 0 otherwise. The Tag Value 182 is a physical RAM address only when MI=I.

The Modified (MD) flag 186 of a page is automatically set by the VMU 110 hardware whenever a write operation is performed to any location in that page. The Used (U) flag 188 of a page is automatically set by the VMU 110 hardware whenever a read or a write operation is performed on any location in that page. Thus, the VMU 110 stores two types of memory usage information in the Page Table.

The MappedOut (MO) flag 190 is used by the VM Manager 150 of the present invention to denote pages that have been mapped out of the Work Space. Pages whose PTE has MO=1 may be either in the Compression Heap or in secondary memory.

The NoSwap (NS) flag 192 is used by the VM Manager 150 to mark virtual memory pages that must be kept resident in primary memory. These pages are indicated generally in FIG. 4.

The WorkSpaceUsed (WSU) flag 194 is a cumulative use flag used by the VM Manager to keep track of all virtual memory pages used during a particular period of time herein called a Epoch. In the preferred embodiment an Epoch is about three seconds long, excluding time spent swapping pages out of the Work Space.

VIRTUAL MEMORY MANAGER

Referring to FIG. 6, the VM Manager 150 includes a number of procedures 200–216 that will be described below. The VM Manager 150 maintains two data structures 220–222 for storing memory usage information. The LRU table 220 stores a 16 bit value for each physical RAM page, indicating which pages were least recently used, and the Best 128List 222 is a list of up to 128 virtual memory pages that are candidates for being swapped out of the Work Space. The VM Manager also stores a number of miscellaneous pointers and data values 224 used to denote that status of various tasks the VM Manager performs.

The following is a description of the VM Manager procedures used in a preferred embodiment of the present invention.

Receive Fault—VMM Procedure

Referring to Table 1, the Receive Fault procedure is the top level procedure for processing a received page fault. The Receive Fault procedure receives the page number (Page#) of the virtual memory page on which the fault occurred, the page's tag value (tag) and the status flags from the page's Page Table Entry.

The primary job of the Receive Fault procedure is to call the GetPage procedure 202, which gets a page of RAM to satisfy the fault and maps that page into the virtual page address for the Transient Page. If the faulting page has status flags MI=0 and MO=0, that virtual memory page is currently unused, and thus it does not need to be swapped in from the MappedOut storage space 130.

Normally, the RAM page used to satisfy the fault on a page with MI=0 and MO=0 must be initialized, typically by filling it with zeros. This is (A) to make the page highly compressible if the page is later swapped out, and (B) to make sure that data left in the RAM page is not transferred to another application (which is a concern mostly in multi-processing computer systems). However, if the MD status flag is equal to 1, the page is not initialized because another VM Manager procedure (the Read Pending procedure) sets a page's status flags MI, MD, MO=0, 1, 0 only when that page is about to be filed with data from an external source, such as a disk or network.

When a page fault occurs on a virtual page that is in the MappedOut storage space, the status flags MI, MD, MO=0, 0, 1. In this case, after the GetPage procedure installs a RAM page into the Transient Page address, the contents of the virtual page are retrieved and copied into this RAM page by calling the ReadCompPage procedure. The contents of the previously mapped out page are then flushed from Mapped-Out storage by calling the ReleaseCompPage procedure.

Finally, the physical RAM page previously mapped into the Transient Page address is mapped into the virtual memory page at which the page fault occurred by calling the MapPage procedure 203.

Every time a page fault occurs, the ReceiveFault procedure also checks to see if the WSU status flags in the Page Table need to be cleared. In particular, each time a three second timer called ElapsedEpochTimer expires the WSU flags are cleared and the timer is restarted. In addition, whenever a foreground context change occurs the WSU flags are cleared. The use of the WSU flags will be discussed below when the BuildBest128List procedure is explained.

Get Page—VMM Procedure

Referring to Table 2, the GetPage procedure 202 basically repeats two steps until the Compression Manager 152 hands it a free physical RAM page that can be mapped into the virtual memory page upon which a fault has occurred. The first step is to call the Compression Manager procedure called GetCompPage(PageAdr,fail). If the Compression Manager 152 has more than two pages of free space in its Compression Heap 124, it returns the currently virtual address (PageAdr) of a RAM page at the end of the Compression Heap 124, and a fail flag equal to False. If the Compression Manager has less than two pages of free space in the Compression Heap 124, it returns a fail flag equal to True.

If the call to GetCompPage results in the receipt of a RAM page from the Compression Manager, the VM Manager procedure GetPage (A) maps that RAM page into the page table entry for the Transient Page, and (B) un-maps the RAM page from the end of the Compression Heap.

If the call to GetCompPage results in a fail flag signal from the Compression Manager, the VM Manager procedure GetPage calls the SwapOutPage procedure 204, which swaps one page from the active Work Space to the Mapped-Out storage space, and then the GetPage procedure once again calls GetCompPage to try to get a free RAM page to map into the virtual memory page upon which a fault has occurred. GetPage repeatedly calls GetCompPage and SwapOutPage until a free RAM page is received from the Compression Manager.

Each call to the SwapOutPage procedure swaps one of the least recently used pages in the active Work Space to the MappedOut storage space. Thus, each call to SwapOutPage reduces the Work Space by one page. However, the Compression Manager attempts to compress each page it receives from the SwapOutPage procedure, and thereby generates "free" RAM pages to hand back to the VM Manager. For instance, if the Compression Manager receives two swapped out pages, and compresses each by a ratio of 3:1, the two compressed pages will occupy just two-thirds of a page, and thus the Compression Manager will have generated one and one-third free pages of storage space.

In one circumstance the SwapOutPage procedure does not swap a page out to MappedOut storage, and instead hands a RAM page directly over to the GetPage procedure. This happens when the page selected by the SwapOutPage procedure to swap out is an uninitialized page, which means that while a RAM page is mapped into the selected virtual memory page, the virtual memory page has not been used. In this case the SwapOutPage procedure returns the virtual address of this uninitialized page, and GetPage then maps that page into its new virtual address (i.e., TransientPage-Adr).

MapPage—VMM Procedure

The MapPage procedure (A) maps the physical RAM page previously obtained by the GetPage procedure into the page table entry for the virtual memory page on which the fault occurred, and (B) updates the "#UncompressedPages" value maintained by the VM Manager to indicate the increased number of pages in the Work Space, and then returns control to the ReceiveFault procedure.

Swap Out Page—VMM Procedure

Referring to Table 3, the SwapOutPage procedure 204 makes use of the Best128List 222. Each time the SwapOutPage procedure is called, a swap counter, #Swaps, is incremented and compared with the SwapThreshold value. When the #Swaps is greater than the SwapThreshold, the AgingEvent procedure 206 is called and the swap counter #Swaps is reset to zero.

As discussed below, the AgingEvent procedure 206 updates the Best128List, which is a list of pages that are candidates for being swapped out to the MappedOut storage space. The AgingEvent procedure also updates a flag called GrowWS. GrowWS is True when the VM Manager has determined that the Work Space needs more primary memory pages, and is False otherwise.

The SwapOutPage procedure contains a loop that executes repeatedly until a page is found that can be swapped out of the Work Space. In the first part of the loop a page to be swapped out is selected. This is accomplished by looking through the pages listed in the Best128List. If the GrowWS flag is True, the pages listed in the Best128List are inspected and the first page in that list which has a True MappedIn status flag and a False Used flag is selected. Thus, any page in the Best128List which is currently in the WorkSpace and which was not recently in use is eligible to be swapped out. If the GrowWS flag is False, the pages listed in the Best128List are inspected and the first page in that list which has a True MappedIn status flag, a False Used flag, but which does not have MI,MD ,MO=1,0, 1, is selected. The logical address of the selected page is stored in the variable PG.

The status flag value MI,MD,MO=1,0,1 is a special status flag combination for pages that were previously sent to the Compression Manager and which returned by the Compression Manager as being "incompressible". Pages are denoted as being incompressible when the Compression Manager is unable to compress the page by more than a predefined percentage, such as 12.5 percent. Pages known to be incompressible are swapped out only when the GrowWS flag is True.

If the entire Best128List is inspected and no eligible page for swapping out is found, the SwapOutPage procedure calls the BuildBest128List procedure 208, which regenerates the Best128List based on the current page usage information. The search for a page eligible to be swapped out is then repeated through the regenerated Best128List. This search will be successful, because the regenerated Best128List will include only pages whose Used flags are False, unless the only pages in the Best128List are pages previously marked as incompressible (which is very unlikely to ever be the case). Since the LRU table's usage data for incompressible pages is set to the maximum possible value (FFFF) when the SwapOutPage procedure first tries to swap out those pages, such pages rarely make it back to the Best128List.

However, if the Best128List still doesn't have any pages eligible for being swapped out, the AgingEvent procedure is called, which updates the LRUtable upon which the Best128List is based and also rebuilds the Best128List. The search through the Best128List for a page eligible to be swapped out is then repeated. This process of searching the Best128List and calling the AgingEvent procedure if no swappable pages are found is repeated until a swappable page is selected.

Once a swappable page has been selected, the aging data for the selected physical RAM page is set to FFFF, which ensures that this RAM page will not be selected again in the near future for swapping out again. In addition, if the selected page is an uninitialized page, indicated by MI,MD, MO=1,0,0, this page can be directly remapped to a new location in the virtual address space and does not need to be sent to the compression manager. Thus, when an uninitialized page is selected, its current virtual address is stored in the PageAdr return argument, the ElapsedEpochTimer is reset to the value it had when SwapOutPage was called, and the SwapOutPage procedure exits, returning control to the GetPage procedure.

The second part of the SwapOutPage control loop is to swap out the selected page by calling the WriteCompPage procedure using parameters PG, GrowWS, Tag, and Fail, where PG is the logical address of the page to be swapped out, and GrowWS is the flag indicating if the Work Space needs to increase in size. Tag is a tag value returned by the Compression Manager that must be stored in the Page Table in order to be able to recover the swapped out page from the MappedOut storage space, and Fail is a flag that is set when (A) the page selected to be swapped out is determined to be incompressible and (B) the GrowWS flag is False.

The WriteCompPage procedure is allowed to return a Fail value of True only when GrowWS is False. If WriteCompPage returns a Fail value of False, the page has been stored in the MappedOut storage space and the SwapOutPage procedure marks the page as being in the MappedOut storage space by (A) storing the returned Tag value in the Page Table Entry for the swapped out page, and by storing status flags MI,MD,MO=0,0,1 in the Page Table Entry for the swapped out page. In addition, when a page is swapped out to the MappedOut storage space, the SwapOutPage procedure decreases the #UncompressedPages count value of pages in the Work Space by one.

If WriteCompPage returns a Fail value of True, the SwapOutPage procedure marks the page as incompressible by storing status flags MD,MO=0, 1 in the Page Table Entry for that page. Furthermore, the process of selecting a page to swap out and then attempting to swap out that page is repeated until a page is successfully swapped out to the MappedOut storage space.

The ElapsedEpochTime timer is reset at the end of the SwapOutPage procedure to the time value it had when the SwapOutPage was called, thereby removing time spent in the SwapOutPage procedure from the measurement of the elapsed time for each work space usage epoch.

Aging Event—VMM Procedure

The LRU table 220 contains one 16-bit value for each physical RAM memory page. The data in the LRU table 220 is generated by shifting the Used status bits (U) from the Page Table into the LRU table at a rate such that the contents of the LRU table are completely replaced each time the number of swapped out pages equals the number of pages in the Work Space. If the number of uncompressed pages (#UncompressedPages) in the Work Space is 2048, then the SwapOutPage procedure generates a SwapThreshold value of 2048/16=128 swaps. When the number of calls to the SwapOutPage procedure exceeds this SwapThreshold, the SwapOutPage procedure calls the AgingEvent procedure 206.

Referring to Table 4, the AgingEvent procedure 206 makes one pass through the Page Table 146 to collect the Used status bits in all the virtual memory pages that are currently mapped into the Work Space. Thus, pages that are designated as being unswappable by a NS status flag equal to 1, pages in MappedOut Storage and uninitialized nonresident virtual memory pages are ignored. For each virtual memory page in the Work Space, the physical RAM page number is obtained from that page's Page Table Entry. That RAM Page number is then used as an index to access an entry in the LRUtable 220, and that entry in the LRUtable is updated by right shifting the Used status bit of the virtual memory page in the LRUtable entry. Thus, the least significant bit of the LRUtable entry is discarded and the most significant bit of the LRUtable entry is set equal to the Used status bit.

From the above it can be seen that the pages least recently used will have the smallest values stored in the LRUtable.

In addition, for each virtual memory page in the Work Space, (A) the Used status bit from the Page Table Entry is logically ORed with the Work Space Used status bit (WSU) and stored as the updated WSU status bit in the Page Table Entry, (B) the Used status bit is cleared, and (C) a variable called #PagesUsed is increased by "1" if that page's WSU status bit is equal to "1". The variable #PagesUsed represents the number of swappable virtual memory pages that have been accessed since the last time all the WSU status bits were reset.

As the data in the LRUtable is updated, the AgingEvent procedure also regenerates the Best128List. The Best128List 220 is a table having 128 slots for storing virtual page numbers, plus a count #BestEntries indicating the number of entries in the Best128List, and an age value BestAge, indicating the value in the LRUtable for the pages listed in the Best128List.

When the AgingEvent procedure begins, the #BestEntries variable is set to zero and the BestAge is set to FFFF. Each time an LRUtable entry is updated, the LRUtable value is compared with the BestAge value. If the LRUtable entry is less than the BestAge, the Best128List is restarted by setting BestAge to the LRUtable entry's value, storing the current virtual page number if the first slot of the Best128List, and by setting the #BestEntries to 1. If the LRUtable entry is equal to the BestAge, the current virtual page is added to the Best128List by storing its virtual page number in the slot of the Best128List designated by the #BestEntries value, and by then increasing the #BestEntries by 1.

Finally, after all the virtual memory pages have been processed and the Best128List regenerated, the GrowWS flag is regenerated by setting this flag to True if the value of #PagesUsed (computed by the AgingEvent procedure) is greater than the value of #UncompressedPages (which is the number of swappable pages in the Work Space).

The order in which the Page Table Entries in the Page Table are processed by the AgingEvent procedure affects the order in which virtual pages are represented in the Best128List. To prevent any bias for swapping out pages in any particular portion of the virtual address space, the AgingEvent procedure maintains a pointer, StartSweepPtr, that is shifted by one Page Table Entry each time the AgingEvent or BuildBest128List procedure is called. The StartSweepPtr designates the page table entry at which the sweep through the Page Table begins for updating the LRUtable and for regenerating the Best128List.

Build Best 128 List—VMM Procedure

Referring to Table 5, the BuildBest128List procedure 208 is virtually the same as the AgingEvent procedure 206, except that the BuildBest128List procedure does not update the aged memory usage data in the LRUtable and does not clear the Used status bits in the Page Table in addition, if the Best128List generated by the BuildBest128List has zero entries (which can happen if all pages in the Work Space have been used since the last time the Used status flags were cleared by the AgingEvent procedure), the BuildBest128List procedure calls the AgingEvent procedure to update the LRUtable, clear the Used status bits in the Page Table, and then rebuild the Best128List of potentially swappable pages.

Read Pending—VMM Procedure

Referring to Table 6, the Read Pending procedure is called each time a Read from an external source occurs. A Read operation occurs whenever a disk read occurs, or a read from another I/O port is performed. The Read Pending procedure provides special handling for pages of virtual memory in MappedOut Storage that are about to be overwritten by data from an I/O device. In particular, if the virtual memory page that is about to receive data from an I/O read has MI,MO=0, 1, there is no point in restoring the page of data stored in MappedOut Storage, because that data is about to be overwritten. The Read Pending procedure (A) releases the previously stored virtual memory page from the MappedOut store by calling the ReleaseCompPage procedure, and (B) stores status flags of MI,MD,MO=0,1,0 in the Page Table Entry for each of the pages that the read operation will entirely fill with data. This status flag setting is a special marker indicating that the virtual page need not be initialized when a new RAM page is mapped into this virtual memory page, because it will be filled with data from an upcoming read operation.

The Read Pending procedure also clears the MD and MO bits for all virtual memory pages that are currently mapped into the Work Space that are about to receive data from an I/O read so as to indicate that these pages are mapped in, but uninitialized. Clearing the Modified status flag (MD) also helps to ensure that the contents of these pages does not get stored in the MappedOut storage space before the read operation is completed.

After these Page Table operations are performed, processing returns to the operating system read procedure that normally handles read operations.

Deallocate Pages and Deallocate Memory Range—VMM Procedures

Virtual memory pages are typically deallocated when an application terminates, or when an application completes a task and releases the memory used for that task. Like the Read Pending procedure described above, the VM Manager's DeallocatePages procedure performs special Page Table operations to ensure proper handling of page deallocations. In particular, referring to Table 7, when pages in MappedOut Storage are deallocated, the DeallocatePages procedure releases the previously stored virtual memory page from the MappedOut store by calling the ReleaseCompPage procedure, and (B) stores status flags of MD,MO,U and WSU= 0,0,0,0 in the Page Table Entry for release page.

The Page Table Entries for deallocated pages mapped into the Work Space are modified by setting the MD, MO, U and WSU status bits to zero. In addition, these deallocated pages are filled with zeros (or any other repeating word value) to make the page highly compressible. For instance, if the page is later reused, but only a small portion of the page is used before it is swapped out, the unused portions of the page will be very highly compressible because the page was pre-filled with compressible data (i.e., cleared) upon its prior deallocation. Finally, a value of 0000H is stored in the LRUtable entry for the deallocated pages, thereby making the RAM pages in which these virtual memory pages are stored highly eligible for reuse.

Address ranges not beginning and ending on page boundaries can be deallocated at any time by application and system programs for a wide variety of reasons. The DeallocateMem procedure fills any partial pages in the deal located address range with compressible data (e.g., zeros), and calls the DeallocatePage procedure (discussed above) to handle the deal location of any complete pages in the deallocated address range.

VMM Initialization Procedure

Referring to Table 8, the VMM Initialization Procedure is executed during or at the end of the computer's boot sequence. This procedure extends the Page Table to include the virtual memory address space needed for the Work Space and for the Compression tables and Compression Heap. It also installs the VM Manager, VM Compression Manager, and the Compression Manager Tables, assigns an initial set of RAM pages to the Compression Heap, and assigns all remaining RAM pages to the next logical addresses to be assigned by the operating system.

In multiprocessing implementations, the remaining RAM pages would be added to the end of the Compression Heap, which acts as a RAM page free list.

The NS, U and WSU status flags in the Page Table are initialized to indicate the unswappable pages used by the VM Manager and VM Compression Manager and to clear the Used and WorkSpaceUsed status flags in all Page Table Entries.

The LRUtable is cleared and the Best128List is initialized by storing therein a list of 128 pages that have been mapped into the Work Space, but not yet initialized. The GrowWS flags is initially set to False, the ElapsedEpochTime is set to zero and the ElapsedEpochTime timer is started.

VM COMPRESSION MANAGER

We will first explain the primary data structures used by the Compression Manager, and then will explain the primary procedures used by the Compression Manager to compress, store and retrieve pages from MappedOut storage.

Referring to FIGS. 9–13, the Compression Manager uses a variable amount of secondary memory to store Mapped Out pages for which there is insufficient room in the Compression Heap 124. When the user accessible virtual memory address space is equal to twice the size of the physical primary memory, it is unusual for any pages to need to be swapped out to secondary memory. However, if most of the contents of the virtual memory address space is highly incompressible, it would be possible for MappedOut storage to occupy an amount of space in the secondary memory that is equal to the size of the physical primary memory. In the preferred embodiment, the Compression Manager initially creates only a small disk file for storing MappedOut pages, and then grows that file as necessary.

Figure 10:
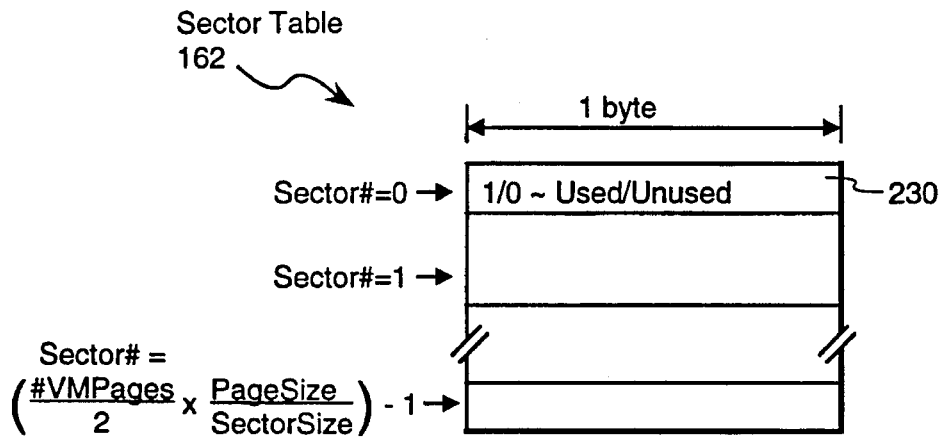
FIG. 10 is a diagrammatic representation of a "Sector Table" used in a preferred embodiment of the present invention to store data indicating which sectors of a secondary memory devices have been used to store swapped out virtual memory pages.

Referring to FIG. 10, the Sector Table 162 is sized so that it can store one used/unused flag value 230 for each sector of secondary (disk) memory that the MappedOut storage space could potentially occupy. A sector of secondary memory in the preferred embodiment stores 512 bytes of data, and thus 8 sectors would be needed to store a 4096 byte page of uncompressed data. In a system with 8 MBytes of RAM, the Sector Table 162 contains 64K entries 230 for indicating the used/unused status of up to 64K secondary memory sectors.

Every page stored in MappedOut storage is assigned a unique tag value between 1 and #VMPages-1, where #VMPages is the maximum number of user accessible virtual memory pages. A Tag value of zero is never assigned to a MappedOut page.

The Main Map

Figure 11:
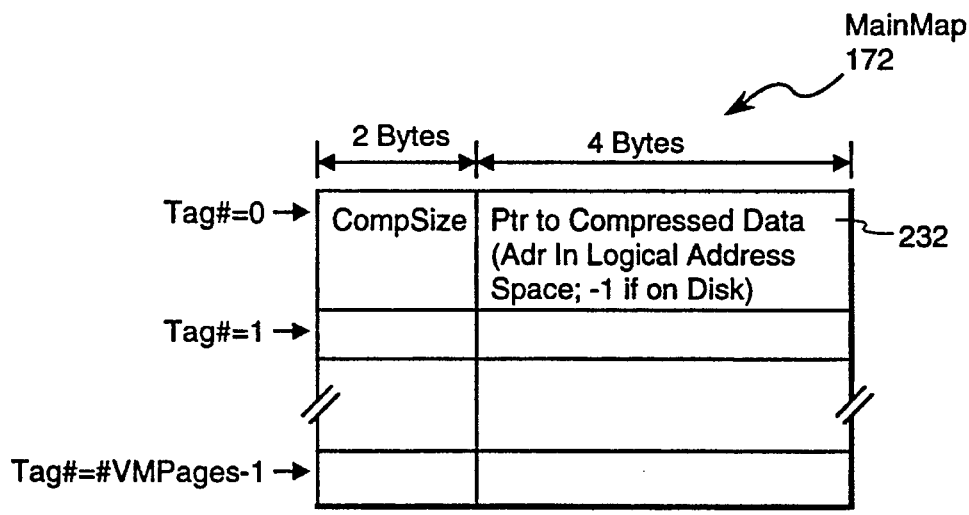
FIG. 11 is a diagrammatic representation of a "Main Map" table used in a preferred embodiment of the present invention to store data representing all virtual memory pages that have been swapped out of the computer's work space.

Referring to FIG. 11, the Main Map table 172 contains one 6-byte entry 232 for each possible tag value. Each entry 232 in the Main Map 172 includes a 2-byte compression size parameter CompSize, and a 4-byte pointer. The 4-byte pointer normally stores the logical address of the location in the Compression Heap in which the page is stored (actually the location of the end of the first data segment in the Compression Heap in which the page is stored, as will be explained in more detail below). When a page is stored in secondary memory, its Main Map pointer is set equal to −1.

Certain special values of the CompSize parameter are used to indicate MappedOut pages having a special status. In particular, when CompSize=4096, this means that the MappedOut page is being stored in uncompressed form, (e.g., because the Compressor was unable to compress this page). When CompSize=−1, this means that all 16-bit words in the page are identical in value, in which case the page is not stored in the Compression Heap 124, and instead the value of the repeated 16-bit word is stored in the bottom 2-bytes of the Main Map pointer for that page. Finally, when CompSize is less than or equal to 1024, this means the page was compressed by a factor of at least 4:1, in which case the page will never be swapped out to the secondary memory.

The Map Chain

Figure 12:
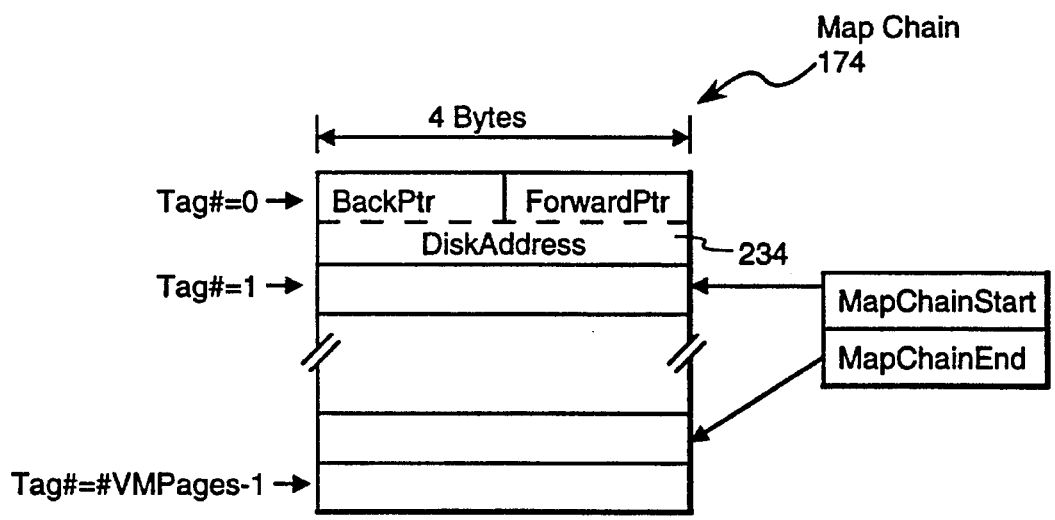
FIG. 12 is a diagrammatic representation of a "Map Chain" table used in a preferred embodiment of the present invention to store data indicating the order in which certain virtual memory pages were swapped out of the computer's work space.

Referring to FIG. 12, the MapChain table 174 stores data indicating the order in which the pages in the Compression Heap were added to MappedOut storage. The MapChain table stores a doubly linked list of MappedOut pages, based on their tag values. In particular, the MapChain table 174 contains one 4-byte entry 234 for each possible tag value. Each entry 234 in the MapChain table 172 includes a 2-byte Back Pointer and a 2-byte Forward Pointer. The Back and Forward Pointers for a particular MapChain entry 234 contain the tag numbers of MappedOut pages before and after the page corresponding to that MapChain entry.

Two additional pointers, MapChainStart and MapChainEnd are used to indicate the first and last pages currently included in the MapChain.

When a page is removed from MappedOut storage or is moved to secondary storage, it is removed from the MapChain table 174 using the RemoveFromMapChain procedure shown in Table 14. In addition, the pointer for the page in the MapChain is set equal to −1 (to indicate the page is stored in secondary memory) and a pointer to the first sector in the secondary memory in which the page is stored is then stored in the MapChain entry for that page. Thus, the pages at the beginning of the MapChain are the pages added to the Compression Heap 124 the longest ago, and thus are the best candidates for being moved to the secondary storage should it become necessary to shift some MappedOut pages to secondary storage.

The Compression Heap

Figure 13:
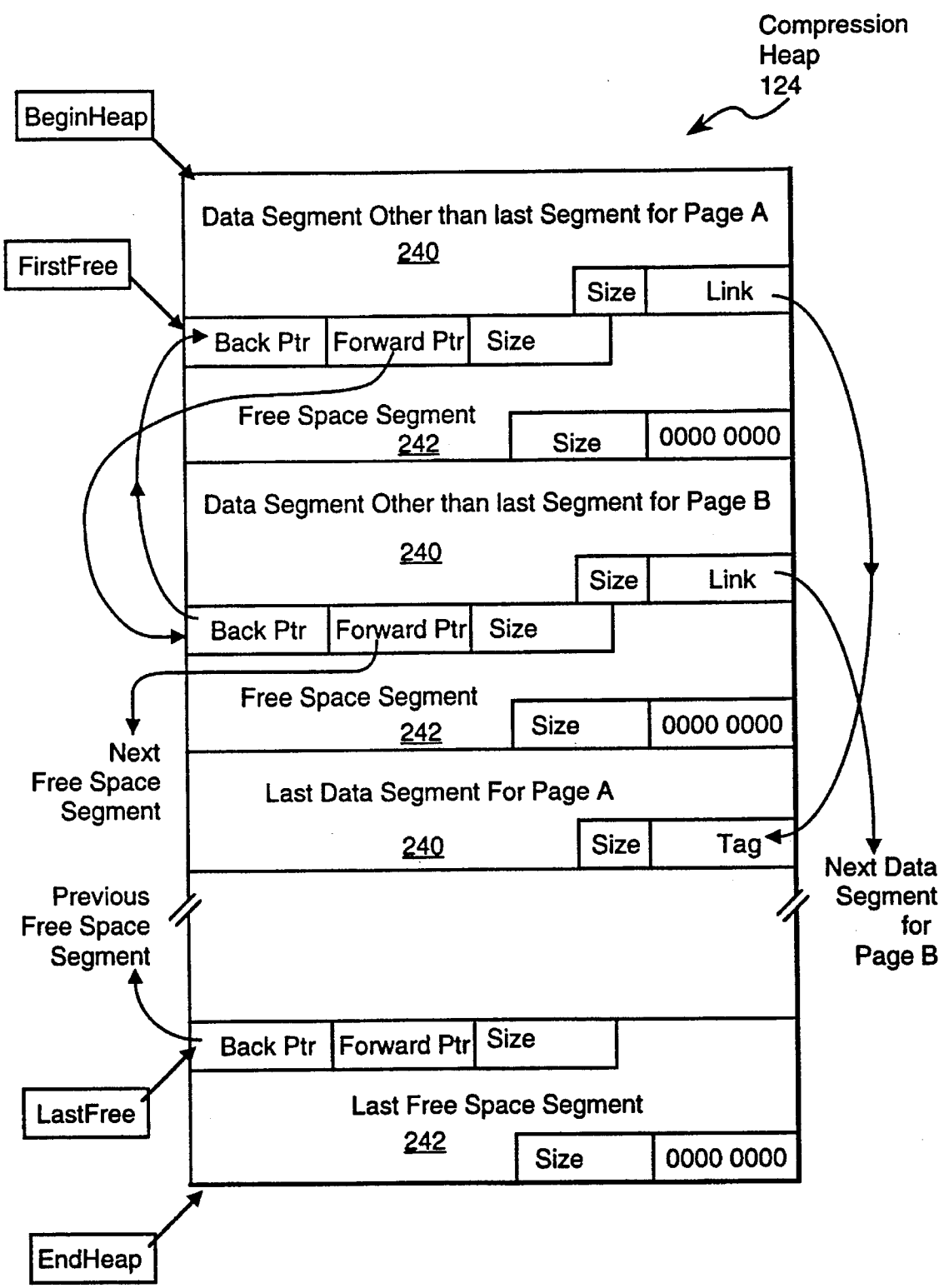
FIG. 13 is a diagrammatic representation of the "Compression Heap" used in a preferred embodiment of the present invention to store virtual memory pages swapped out of the computer's work space.

Referring to FIG. 13, the Compression Heap 124 is organized as follows. The Compression Heap 124 always contains at least two pages of storage space and the pages in the Compression Heap are outside the virtual address space accessible to application programs. The Compression Manager maintains a pointer, EndHeap, to the virtual address location just past the end of the Compression Heap. The Compression Heap is divided into variable size data "segments" 240 (which contain data from pages, usually in compressed form) and Free Space segments 242. Initially, the entire Compression Heap is a single Free Space segment. As pages are added to the Compression Heap, each page is allocated just enough space to store that page (usually in compressed form) in the Compression Heap. Whenever a page in the Compression Heap is released or returned to the Work Space, its space is added to the set of Free Space.

The set of Free Space segments 242 are maintained as a doubly linked list that is sorted in logical address order. Thus, each Free Space segment 242 in the list is located at a higher logical address than the Free Space segment next lower in the list. Two pointers, FirstFree and LastFree point to the first and last Free Space segments.

As shown in FIG. 13, each Free Space segment contains a 4-byte Back Pointer, to the preceding Free Space segment in the list (if any), a 4-byte Forward Pointer to the next Free Space segment in the list (if any), a 4-byte size parameter that specifies the number of bytes in the Free Space segment, and an end-of segment 4-byte marker equal to 00000000 H at the end of the segment. The Back and Forward Pointers in the Free Space segments point to the beginning of other Free Space segments.

The minimum size of a Free Space segment is 16 bytes. If a Free Space segment is 20 bytes or larger, its size parameter is repeated in the 4-bytes preceding the end-of-segment marker.

Each data segment contains a 4-byte Link at its end, preceded by a 2-byte Size parameter, which indicates the size of the data segment in bytes. When a page is stored as a set of linked data segments in the Compression Heap, the Link at the end of each data segment, other than the last data segment, points to a location 6 bytes before the end of the next data segment for that page. The Link of the last data segment for the page stores the 2-byte tag value for the page, for reasons that will be explained below.

The Compression Manager includes the following procedures. GetCompPage 250 is a procedure called by the VM Manager to get a free RAM page to satisfy a page fault. FillFromBottom 252 is a procedure called by GetCompPage 250 when the Compression Heap has enough free space that the Compression Manager can give a free RAM page to the VM Manager, but not enough of that Free Space is located at the end of the Compression Heap to enable the Compression Manager to give the last page in the Compression Heap back to the VM Manager.

WriteCompPage 254 is a procedure called by the VM Manager to write a page in the Work Space into MappedOut Storage. ReadCompPage 256 is a procedure called by the VM Manager to copy a page in MappedOut storage into a page in the Work Space. ReleaseCompPage 258 is a procedure called by the VM Manager to delete a page from the MappedOut Storage. RemoveFromMapChain 260 is a procedure called by the ReleaseCompPage procedure to delete a specified page from the chain of pages in the MapChain table 174.

Compress 262 and Decompress 264 are the procedures for compressing a specified page of data and for decompressing a specified page of data, using a version of the Lempel-Zif data compression technique optimized for execution speed. SwapOutFlag, FreeHeapBytes, etc.

The SwapOutFlag is a copy of the last GrowWS flag received from the VM Manager. When the SwapOutFlag is True, the Compression Manager stores MappedOut pages on secondary memory (A) whenever that is necessary to satisfy "GetPage" requests from the VM Manager, and also (B) whenever the VM Manager sends the Compression Manager an incompressible page to compress and store.

FreeHeapBytes is the variable maintained by the Compression Manager to keep track of the number of bytes available in the Compression Heap for storing Mapped Out pages.

Get Compressed Page—Compression Manager Procedure

Referring to Table 9, the GetCompPage procedure has four primary sections. In the first section of GetCompPage, the procedure checks the amount of Free Space in the Compression Heap and the total size of the Compression Heap. The GetCompPage procedure will return a fail signal to the VM Manger (A) if the SwapOutFlag is False and the Compression Heap has less than 2 free pages of Free Space, or (B) if the SwapOutFlag is True and the total size of the Compression Heap is less than three pages (because the Compression Heap must always retain at least two pages of RAM). If either of these failure modes occurs, the GetCompPage procedure returns control to the VM Manager and does not perform the next three sections of the procedure.

In the second section of the GetCompPage procedure, if the Free Space in the Compression Heap is less than two pages and the SwapOutFlag is True, the GetCompPage procedure successively moves pages from the beginning of the MapChain to secondary memory until the Free Space in the Compression Heap is greater than two pages (i.e., FreeHeapBytes>2×PageSize). To do this, this second section of GetCompPage repeatedly performs the following functions, until Free Space in the Compression Heap is greater than two pages:

1) Select the first page listed in the MapChain table 174, and determine its size from the CompSize value stored for that page in the Main Map 172.

2) Inspect the SectorMap table 162 to find the first contiguous set of available sectors sufficiently large to store the selected page.

3) Copy the page to the selected region of secondary memory.

4) Add the data segments in which the page Was stored in the Compression Heap to the list of Free Space segments, updating Free Space segment links and the FirstFree pointer, as necessary. If any new Free Space segment is adjacent a pre-existing Free Space segment, the adjacent new and pre-existing Free Space segments are merged.

5) Update the Main Map and Map Chain to store in the Map Chain entry for the page a pointer to the first sector in which the page was stored.

6) Update the FreeHeapBytes variable to indicate the amount of Free Space in the Compression Heap.

The second section of GetCompPage, described above, is skipped if the Free Space in the Compression Heap is already greater than two pages.

After the second section of GetCompPage has been performed or skipped, the third section of GetCompPage checks to see if the size of the last Free Space segment 242 in the Compression Heap is smaller than one page plus 16 bytes—which is the minimum size needed to ensure that the Compression Heap still has a Free Space segment at its end after a page at the end of the Compression Heap is given to VM Manager. If the size of the last Free Space segment 242 is less than this size, the FillFromBottom procedure (which moves data segments from near the end of the heap to the top of the Free Space) is called, repeatedly if necessary, until the size of the last Free Space segment 242 in the Compression Heap is at least one page plus 16 bytes.

The fourth and last section of GetCompPage computes the logical address of the last page in the Compression Heap (which will be returned to the VM manager), updates the EndHeap pointer by moving it back one page, and decreases the size of the Free Space by subtracting the PageSize from the FreeHeapBytes variable. Then GetCompPage returns control the VM Manager.

Fill From Bottom—Compression Manager Procedure

Referring to Table 10 and FIG. 13, the FillFromBottom procedure increases the size of the last Free Space segment at the end of the Compression Heap.

This is accomplished by performing the following steps:

1) Find the last data segment in the Compression Heap by looking at the Tag stored at the end of that data segment (which is located 2 bytes before the beginning of the last Free Space segment).

2) Using the Tag, look up the location of the first data segment for that page in the Main Map, as well as the size of the page.

3) Copy the entire page from the Compression Heap 124 into the compression buffer 170.

4) Add the data segments in which the page was stored in the Compression Heap to the list of Free Space segments, updating Free Space segment links and the FirstFree pointer, as necessary. For each new Free Space segment that is adjacent a pre-existing Free Space segment, the adjacent new and pre-existing Free Space segments are merged. Update the FreeHeapBytes variable to reflect the data segments added to the Free Space, as well as Free Space created by merging adjacent Free Space segments.

5) Copy the page from the compression buffer 170 to the top of the Free Space (starting at the first Free Space segment), updating the FirstFree pointer and the Free Space segment links to maintain a doubly linked list of Free Space segments in the Compression Heap.

6) Update the MainMap, if necessary, to indicate the new Compression Heap location of the page that was moved to the top of the Free Space.

7) Update the FreeHeapBytes variable to indicate the space occupied by the moved page. Also, if the Free Space segment into which the end of the page was copied was split into a data segment and a Free Space segment, the FreeHeapBytes variable is decreased by 6 bytes to reflect the amount of space occupied by an additional segment link.

8) Update the LastFree pointer to point to the beginning of the last Free Space Segment (which will now start at a lower address than previously), and then return control to the GetCompPage procedure.

Write Compressed Page—Compression Manager Procedure

Referring to Table 11, each call to the WriteCompPage procedure 254 includes the following parameters: a page address specified by the calling procedure, the GrowWS flag from the VM Manager, a Tag variable in which the Compression Manager should return the tag assigned to the page being written to MappedOut storage, and a fail flag which the WriteCompPage sets to True under certain circumstances.

The WriteCompPage procedure copies the GrowWS flag in the procedure call to the SwapOutFlag and then calls the Compression procedure to compress the data in the page specified by the calling procedure. The Compression procedure stores the compressed page in the Compression Buffer 170 and returns a CompSize parameter indicating the number of bytes occupied by the compressed page.

If the size of the compressed page indicates that it is incompressible (i.e., the page size was reduced by less than a predefined percentage, such as 12.5 percent) and the SwapOutPage flag is False, the specified page is not stored in MappedOut storage and a fail signal is returned to the calling procedure.

If the page was not incompressible, or the SwapOutPage flag is True, the specified page is assigned a Tag value not used by any other page, and the size (CompSize) of the compressed page is stored in the size field of the associated Main Map entry.

Next, if the page was incompressible, the SwapOutPage flag is True, and the amount of Free Space in the Compression Heap is less than two pages, then the incompressible page is stored directly in secondary memory in uncompressed format, by preforming the following steps:

1) Inspect the SectorMap table 162 to find the first contiguous set of available sectors sufficiently large to store the selected page.

2) Copy the uncompressed page to the selected region of secondary memory.

3) Store the size of the uncompressed page in the size field of the associated Main Map entry, store a −1 value in the Main Map pointer field, and store in the Map Chain entry for the page a pointer to the first sector in which the page was stored.

4) Add the RAM page in which the selected page was stored to the end of the Compression Heap.

5) Update the FreeHeapBytes variable by one page to indicate the increased size of the Compression Heap, and update the EndHeap pointer to point to the new end of the Compression Heap.

If the CompSize parameter returned by the Compression procedure is equal to −1, this means that all 16-bit words in the page are identical in value, in which case the page is not stored in the Compression Heap 124, and instead the value of the repeated 16-bit word is stored in the bottom 2-bytes of the Main Map pointer for that page.

Next, if the CompSize parameter indicates the page was compressible, but not filled with identical words, the compressed page is copied from the Compression Buffer into the Free Space in the Compression Heap. On the other hand, if the CompSize parameter indicates the page was incompressible, and SwapOutPage is False, then the page is copied in uncompressed format from its current RAM page into the Compression Heap and the page size stored in the Main Map entry for this page is reset to be equal to the size of one page. In either case, the location of the page in the Compression Heap is stored in the MainMap entry for the page.

Next, if the compression ratio for the page stored in the Compression Heap is less than 4:1 (meaning the compressed page is larger than 1024 bytes in the preferred embodiment), the page is added to the end of the Map Chain by adding the appropriate pointers to the corresponding Map Chain entries. In the preferred embodiment of the invention, when a page is compressed by a factor of at least 4:1, it will never be swapped out to the secondary memory because it would be inefficient to do so.

Finally, the RAM page in which the specified page was stored is added to the end of the Compression Heap, and the FreeHeapBytes variable is updated to indicate the amount of free space in the Compression Heap.

Read Compressed Page—Compression Manager Procedure

Referring to Table 12, the ReadCompPage procedure 256 retrieves a page from MappedOut storage, decompresses it if necessary, and stores the retrieved page in the virtual memory page specified by the calling procedure. The calling procedure specifies both the Tag value of the page to be retrieved, and the virtual memory page into which it is to be copied.

The procedure starts by reading the page's size and location pointer from the Main Map.

If the page size is −1, the specified virtual memory page is filled with the 2-byte value stored in the location pointer field, the Main Map entry for the page is updated by setting its size and pointer to 0, and then the procedure exits, returning control to the calling program.

If the page size indicates that the page was not compressed, then it is copied from either the Compression Heap or Secondary memory, as appropriate, directly to the Transient Page 158 (see FIG. 3).

Retrieving Compressed Pages

If the page size indicates that the page was compressed, then it is copied from either the Compression Heap or Secondary memory, as appropriate, to the Compression Buffer 170. If the compressed page was stored in secondary memory, the Sector Table is updated to indicate the sectors no longer occupied by stored data.

Regardless of whether the compressed page was copied from the Compression Heap 124 or the secondary memory, after it is copied into the Compression Buffer 170 the Decompress procedure is called to decompress the page into a full page of data (stored at the Transient Page address).

Release Compressed Page—Compression Manager Procedure

Referring to Table 13, the ReleaseCompPage procedure 258 deletes the page specified by the calling procedure from MappedOut storage. The calling procedure specifies the virtual memory address of the page to be released.

The procedure starts by determining the tag for the specified page and then reading the specified page's size and location pointer from the Main Map.

If the page's MainMap pointer value is equal to −1, the page is stored on disk. In that case, the Sector Table 162 is updated to show as unused those sectors in which the page was stored, and the Map Chain entry for the page is cleared.

If the specified page is stored in the Compression Heap (and thus does not have a stored size equal to −1) the specified page is deleted by adding the Compression Heap segments in which the page was stored to the set of Free Space segments, updating the Free Space segment links as necessary. If any new Free Space segment is adjacent a pre-existing Free Space segment, the adjacent Free Space segments are merged. Then the FreeHeapBytes variable is updated to indicate the amount of free space in the Compression Heap. In addition, if the page begin released from the Compression Heap has a compressed size that is greater than one fourth a standard page, it is removed from Map Chain by calling the RemoveFromMapChain procedure.

Details of the RemoveFromMapChain procedure are shown in Table 14, but essentially it is just a matter of removing an item from a doubly linked list and then fixing the forward pointer in the item in the list (if any) before the removed item and the back pointer in the item (if any) after the removed item so that the before and after items are properly linked.

Finally the Main Map entry for the specified page is updated by setting its size and pointer to 0, and then the procedure exits, returning control to the calling program.

DATA COMPRESSION AND DECOMPRESSION PROCEDURES

Figure 14:
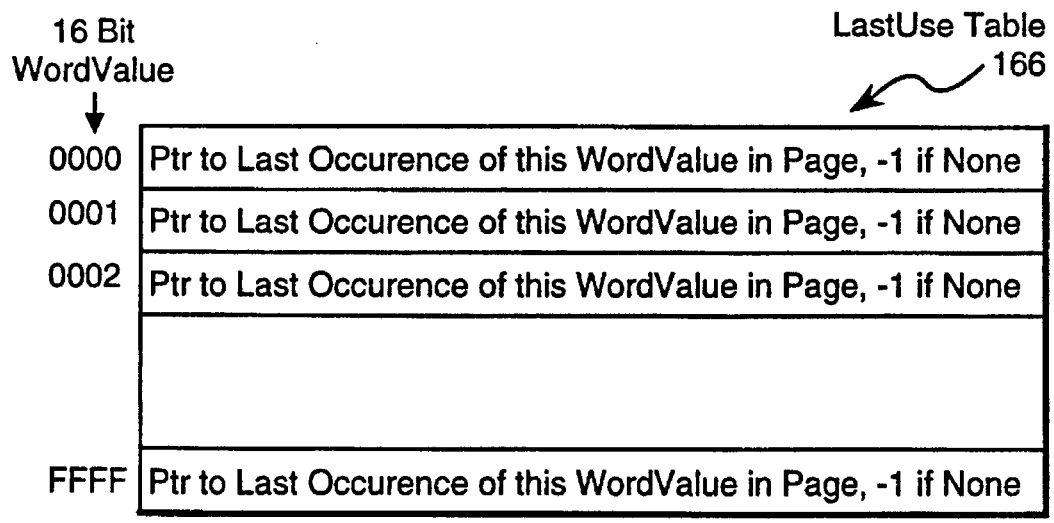
FIG. 14 is a diagrammatic representation of the "Last Use" table used in a preferred embodiment of the present invention during the process of performing a data compression procedure on a virtual memory page.
Figure 15:
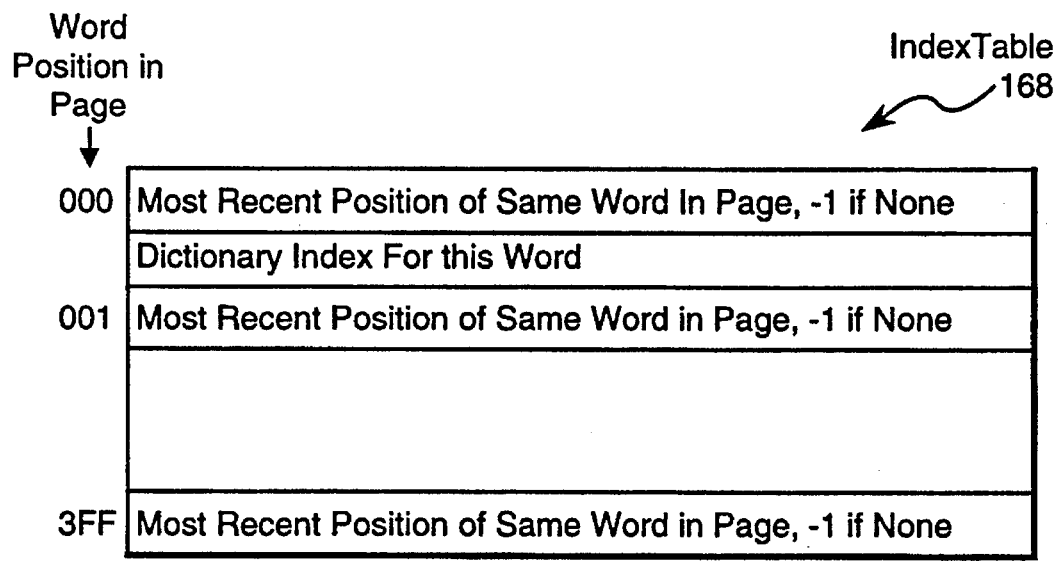
FIG. 15 is a diagrammatic representation of the "Index Table" table used in a preferred embodiment of the present invention during the process of performing a data compression procedure on a virtual memory page.
Figure 16A:
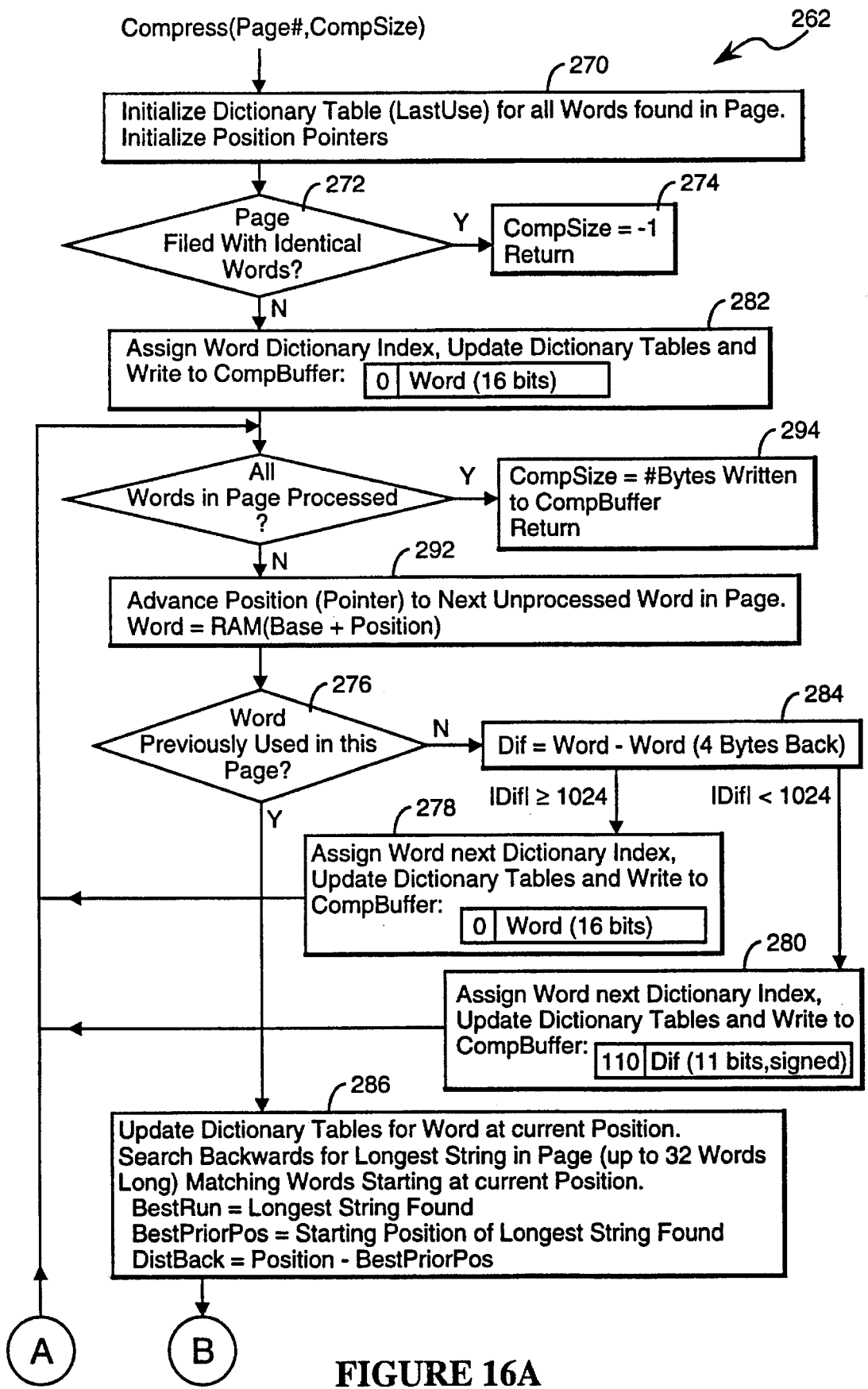
FIGS. 16A and 16B are a flow chart representation of the data compression procedure used in a preferred embodiment of the present invention.
Figures 16, 16B:
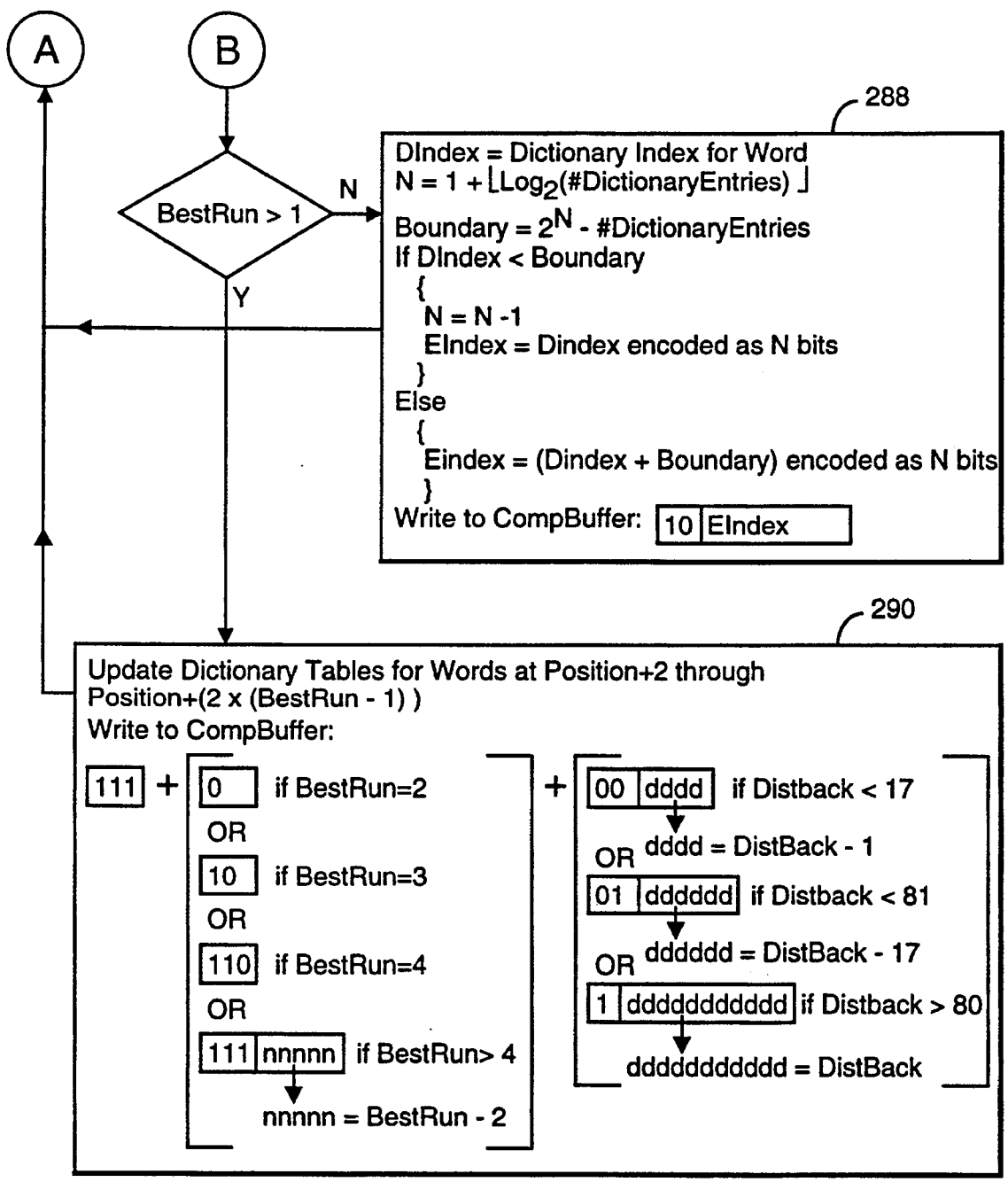

Referring to FIGS. 14, 15 and 16 and Tables 15 and 16, the Compress 262 and Decompress 264 procedures are the procedures for compressing a specified page of data and for decompressing a specified page of data, using a version of the Lempel-Zif data compression technique optimized for execution speed.

The Compression procedure makes use of the LastUse table 166 and Index table 168. Referring to FIG. 14, the LastUse table 166 is a table with 64K 2-byte entries, one for every possible value of a 16-bit word. Each page to be compressed contains 2048 16-bit words. As each word of the page is processed, starting with the first word, the position of that word is stored in the LastUse table:

LastUse(word value)=position of word in the page where the position value stored in the LastUse table is the position of the first byte of the word (i.e., an even number between 0 and 4094).

Referring to FIG. 15, the IndexTable 168 stores one entry, containing two 2-byte fields, for each of the 2048 words in the page to be compressed. The first field of the entry indicates the most recent position in the page, if any, that the same word was previously encountered. The second field of the entry stores the dictionary index for the word at the page position corresponding to this IndexTable entry.

An explicit dictionary is not constructed during the data compression procedure, but each time a new unique word is encountered in the page being compressed, it is assigned a new dictionary index value and that value is stored in the Index Table. The first word in the page is always assigned a dictionary index equal to 0. The dictionary for the page can be reconstructed by inspecting the contents of the IndexTable 168 and the page being compressed.

Compression Procedure

Referring to Table 15 and FIGS. 14–16, the compression procedure 262 works as follows. In a first pass through the page to be compressed, the LastUse table entries for all the words in the page are set equal to −1 (box 270 in FIG. 16). In addition, if any word is not equal to the preceding word in the page, a flag that was initially set to True is reset to False. Thus, at the end of the first pass through the page, the relevant portion of the LastUse table needed for processing the current page is initialized, and the previously mentioned flag value is True only if all the words in the page are identical.

If all the words in the page to be compressed are identical (box 272), then the compressed size parameter, CompSize, for the page is set equal to −1, and the procedure exits (box 274), returning control to the calling procedure. Otherwise, a second pass through the words in the page is performed.

In the second pass through the page, the contents of the page are compressed, with the resulting compressed data being written into the Compression Buffer 170. As each word of the page is processed, the pointer value in the LastUse table for that word is retrieved PriorPos=LastUse(word)

and checked to see if it is equal to −1, indicating the word has not previously occurred in the page (box 276). If so, the word is assigned the next available dictionary index (boxes 278, 280, 282), which is stored in the IndexTable:.

IndexTable(Position).Index=NextIndex

NextIndex=NextIndex+1.

Also stored in the IndexTable is a "prior position" value of −1, indicating the word was not previously used in this page:

IndexTable(Position ).PriorPos=−1.

If the word at the current position did not occur previously in the page, but has a value within a range of ±1023 of the word four bytes earlier in the page (box 284), the new word is encoded (box 280) as a "new word differential" code:

"110" +Dif where "+" indicates the concatenation of two binary strings, and Dif is the difference between the current word and the word four bytes earlier in the page. Dif is encoded as an eleven bit, signed value. Audio data and many other types of data used in computers have a strong correlation with the stored a fixed number of bytes earlier in memory, and the present invention's compression technique takes advantage of this correlation by preferentially encoding such 16-bit words with a 14-bit encoded value.

If the word at the current position did not occur previously in the page, and does not have a value within a range of ±1023 of the word four bytes earlier in the page, the new word is encoded (box 278) as the following 17-bit "new word" code value:

"0"+Word.

Processing for Word Already in the Dictionary

If the word being processed did previously occur in the current page, the LastUse entry for that word value PriorPos=LastUse(Word))

will be a pointer to the last previous use of that word in the page. The PriorPos pointer is then used to access the IndexTable entry for that prior use of the same word, and the dictionary index stored in the IndexTable for the prior use of the same word is copied into the dictionary index field for the current word position. The PriorPos value obtained from the LastUse table is copied into the "most recent prior use" field of the IndexTable for the current word position, and then the LastUse pointer for the current word is updated to point to the current word position (box 286).

Next (still box 286), the compression procedure looks for the longest string earlier in the page (but not starting more than 32 occurrences ago of the current word) that matches the string of words starting at the current position in the page. If a matching string of 32 words is found, no further searching for a better match is performed, since the maximum length matching string that can be encoded in the compressed data is 32 words long. The length of the best matching string is stored in a variable called BestRun, and the position of the first word in the best matching string is stored in a variable called BestPriorPos.

Best Matching Prior String has a Run Length of 1

If the longest prior matching string has a BestRun length of 1, then the current word is encoded as a "repeat one word" code and written to the Compression Buffer (box 288) as:

"10"+EIndex where EIndex is a variable length index value defined as follows. If NextIndex is the number of words currently in the Dictionary, then the dictionary index for the current word is encoded using either N or N-1 bits, where N is equal to 1 plus the integer portion of the logarithm, base 2, of NextIndex. In particular, if the dictionary index for the current word is less than $2^N$ - NextIndex, then EIndex is equal to the dictionary index encoded as N-1 bits. Otherwise, EIndex is equal to the dictionary index plus $2^N$—NextIndex, encoded as N bits. For instance, when the dictionary has 6 entries, the EIndex values for those six dictionary entries are:

| Dictionary Index | EIndex |
| --- | --- |
| 0 | 00 |
| 1 | 01 |
| 2 | 100 |
| 3 | 101 |
| 4 | 110 |
| 5 | 111 |

By encoding EIndex with N-1 bits instead of N bits whenever possible, an average of about two-thirds of a bit is saved for each use of the "repeat one word" code.

Best Matching Prior String has a Run Length Greater than 1

If the longest prior matching string has a BestRun length greater than 1, then the current word and the next BestRun-1 words are encoded as a single "repeat prior string" code, using the coding format shown in box 290 of FIG. 16B. In addition, the LastUse and Index table values for all the words in the repeated string are updated.

After each word or string of words is encoded, the above procedure is repeated starting with the next word of the page (step 292), until all the words in the page have been processed. The number of bytes of compressed data written to the Compression Buffer 170 is stored in the CompSize parameter returned by the Compression procedure to the calling procedure (step 294).

Decompression Procedure

Referring to Table 16, the decompression procedure works as follows. The data to be decompressed is located in the Compression Buffer and the decompressed data is written directly into the virtual memory page specified by the calling procedure. The decompression data comprises a sequence of variable length codes that must be decoded in sequence. The first few bits of each code identify whether the code is a "new word" code ("0"+word), a "new word differential" code ("110"+Dif), a "repeat one word" code ("10"+EIndex), or a "repeat prior string" code ("111"+ BestRun code+DistanceBack code). In addition, decoding the "repeat one word" code and the "repeat prior string" code requires determination of the number of bits used in each such code.

The decompression procedure also generates and stores in the LastUse table a dictionary of words used in the page, with the Xth word in the dictionary being stored in the Xth entry in the LastUse table.

To decompress a compressed page, the decompression procedure sequentially identifies and processes each code in the page. Once a code is identified, if the code is a "new word" or "new word differential" code, the corresponding new word is the added to the dictionary stored in the LastUse table and the count (NextIndex) of the number words in the dictionary is increased. The decoded new word is also written to the specified output page. If the identified code is a "repeat one word" code, the specified dictionary entry is written to the specified output page. If the identified code is a "repeat prior string" code, the procedure determines the position of the first word of the string to be repeated and the number of words to be repeated, and then writes a copy of the specified string to the specified output page. Then the next code in the compressed page is processed. This procedure continues until a full page of uncompressed data has been generated, at which point the decompression procedure exits and returns control to the calling procedure.

ALTERNATE EMBODIMENTS

Using a Co-Processor

One preferred alternate embodiment of the present invention is to use a co-processor that shares access to the computer's primary and secondary memory to perform much of the VM Manager's work. In particular, when the co-processor is not occupied by other tasks, it could perform the function of periodically rebuilding the Best128List and re-evaluating the WSU flags to determine when the work space needs to grow. Furthermore, whenever the number of free pages in the Compression Heap falls below a threshold number, such as six pages, the co-processor could be programmed to select pages from the Best128List and compress and store them in the Compression Heap until the number of free pages in the Compression Heap reached a target level, such as twelve pages, thereby making sure that a reasonable number of "free pages" are available for use by the VM Manager to satisfy page faults. The co-processor would be assigned its own compression buffer, so that both the co-processor and the regular Compression Manager executed by the primary CPU can operate simultaneously. An additional status flag would be needed in the page table entries to indicate pages currently being processed by the co-processor, and an interlock would be needed so that only one of the two co-processors makes changes to the Page Table at any one point in time.

Storing only Decompressed Pages in Secondary Memory

To speed up the fault response time to faults on pages in secondary memory, the present invention could be modified so as to store only uncompressed pages in the secondary memory. Thus, when a page is moved from the Compression Heap to secondary memory, it would first be decompressed and then stored in secondary memory. While this would increase the amount of secondary memory used, it would not increase the number of times the secondary memory is accessed, and it would decrease the fault response time for faults on pages in secondary memory.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

- 49 -

TABLE 1

© Copyright 1993 Connectix Corporation

Top Level Procedure for Processing a Virtual Memory Fault

```
ReceiveFault(page#,tag,flags)      -- VMU Fault signal received

-- (A) Get Page to Satisfy the Page Fault
     If (MI=0 and MO=0)        -- normally means the faulting virtual address
                                  is currently unused
        {
        Call GetPage()  --  Get physical RAM page to satisfy fault
        If MD=0         --  MI,MD,MO=0,1,0 is a special marking for allocated
                            page that will be overwritten by data from disk.
                            Thus, if MD=1, we don't bother initializing the page.
           {
           -- Fill page with highly compressible data
           Call FillPage(TransientPageAdr/PageSize)
           }
        }
     ElseIf (MI=0 and MO=1)   -- Page is located in compressed storage
                                 (either in RAM or on disk)
        {
        Call GetPage()    --  Get physical RAM page to satisfy fault
        -- Retrieve page identified by "tag" from MappedOut Storage and copy
           it into the allocated RAM page at TransientPageAdr
        Call ReadCompPage(tag)
        Call ReleasePage(page#)
        }

-- Map the received page into the specified virtual memory page
     Call MapPage(page#)

     -- (B) Check for Foreground Context Switch
     If Foreground Process Context has changed since the last page fault
        --  Clear the WSU bit flags used for determing if more pages are
            needed in WorkSpace
          { Clear WorkSpaceUsed (WSU) bit flag in all VMPageMap entries}
     -- (C) Periodically Update the WorkSpaceUsed (WSU) Flags
     If ElapsedEpochTime > EpochThreshold  -- Epoch Threshold is nominally
                                              3 seconds.
        {
        Clear WorkSpaceUsed flag (WSU) in all VMPageMap entries
        Restart ElaspedEpochTime timer at ElapsedEpochTime = 0
        }
     Return
```

- 50 -

TABLE 2

Procedures for Getting a RAM Page to Use

```
      GetPage()
          Set Flag1 = False
          Do Until (Flag1)              -- Repeat this Loop until the
                                            Compression Manager sends a RAM
                                            page to use
              {
              -- Ask Compression Manager to send one unused RAM page
              Call GetCompPage(PageAdr,fail)
              If fail=True              -- Compression Manager did not have an
                                            unused RAM page to send
                  {Call SwapOutPage(PageAdr)} -- Swap one page from RAM to
                                                    MappedOut Storage
              If PageAdr ≠ 0            -- Compression Manager did have an unused
                                            RAM page to send, or the SwapOutPage
                                            procedure found an uninitialized page to use
              {
              -- Map the received page into the TransientPageAdr in the VMU
                  page table:
              Set Flag1 = True
              page#                    =TransientPageAdr/PageSize
              RecvdPage#               =PageAdr/PageSize
              RAM_Adr                  =VMPageMap(RecvdPage#).Adr
              VMPageMap(page#).Adr     =RAM_Adr
              VMPageMap(page#).MI      =1      -- Set Mapped In Flag
              -- Leave Modified Flag (MD) unchanged
              VMPageMap(page#).MO      =0      -- Reset Mapped Out Flag -- Un-map the received page from its prior virtual address
              VMPageMap(RecvdPage#).Adr =0
              VMPageMap(RecvdPage#).MI =0
              VMPageMap(RecvdPage#).MD =0
              VMPageMap(RecvdPage#).MO =0

}
          }  -- end of Do Until Loop
       Return

FillPage(Page#)   -- Fill page with highly compressible data (could use any
                               fill value that is repeated for all words in the page)
       Fill all words in specified virtual address page with "0000"
       Return
```

- 51 -

```
    MapPage(Page#)
        --  Map the received page from the TransientPageAdr into the VMU page
            table:
            RecvdPage#              =TransientPageAdr/PageSize
            RAM_Adr                 =VMPageMap(RecvdPage#).Adr
            VMPageMap(page#).Adr    =RAM_Adr
            VMPageMap(page#).MI     =1      -- Set Mapped In Flag
            -- Leave Modified Flag (MD) unchanged
            VMPageMap(page#).MO     =0      -- Reset Mapped Out Flag
            VMPageMap(page#).U      =0      -- Reset Used Flag
            VMPageMap(page#).WSU    =0      -- Reset WorkSpaceUsed Flag --  Update Count of Uncompressed Pages in WorkSpace
            #UncompressedPages = #UncompressedPages + 1
            Return
```

- 52 -

TABLE 3

Procedure for Swapping Out a Page

```
SwapOutPage(PageAdr)

-- (A) Preprocessing before each Page Swap Out:
    PageAdr = 0                      -- Normal return value
    StartTime = ElaspedEpochTime     -- Store ElaspedEpochTime timer
                                        value for restoration at end of
                                        swapping procedure -- LRUtable represents usage history for period in which the number of
        page swaps equals the number of swappable pages in the Work Space
    #Swaps = #Swaps + 1
    SwapThreshold = #UncompressedPages / 16
    If #Swaps > SwapThreshold
        {
        Call AgingEvent()            -- Updates LRU data table
        #Swaps = 0
        }

-- (B) Swap Out Control Loop
    Set Flag2 = False
    PG = 0
    Do Until (Flag2)   -- REPEAT until a page is swapped out
        {
        -- (B-1) SELECT A PAGE TO BE SWAPPED OUT
        If GrowWS        -- WorkSpace needs to grow
            {
            PG = Logical address of page highest on Best128List with MI=1
                 and U=0
            }
        Else             -- WorkSpace does not need to grow
            {
            PG = Logical address of page highest on Best128List which is
                 Mapped In (MI=1) and not currently used (U=0), but which
                 does not have MI,MD,MO=1,0,1 (-- a special marker for
                 incompressible pages (compressed less than threshold, e.g.,
                 12.5%)). Don't bother trying to send an incompressible page
                 to the Compression Manager unless GrowWS is True
            }
        If PG = 0              -- None of the pages in the Best128List are
                                  eligible for being swapped out! Rebuild the
                                  Best128List:
            {
            Call BuildBest128List() -- Rebuilds Best128 list and updates
                                       GrowWS flag
```

- 53 -

```
If GrowWS   --  WorkSpace needs to grow
    {
    PG =    Logical address of page highest on Best128 list with
            MI=1 and U=0
    }
Else        -- WorkSpace does not need to grow
    {
    PG =    Logical address of page highest on Best128 list which
            is Mapped In (MI=1) and not currently used (U=0), but
            which does not have MI,MD,MO=1,0,1
    }

If PG = 0   --  Still no swappable pages in the Best128 list.
    {       --  (all pages in Best128 list are incompressible !)
    Do Until PG ≠ 0
        {
        Call AgingEvent()
        PG =   Logical address of page highest on Best128 list
               which is Mapped In (MI=1) and not currently used
               (U=0), but which does not have MI,MD,MO=1,0,1
        }
    }

-- (B-2) SWAP OUT THE SELECTED PAGE
--  Reset selected page's usage data to FFFF
RAMPage# = VMPageMAP(PG).Adr
LRUtable(RAMPage#) = FFFF --  If selected page is an uninitialized page, just return it and quit.
If VMPageMap(PG).MI,MD,MO=1,0,0
    {
    PageAdr = PG
    --  Restore saved ElaspedEpochTime timer value
    Set ElapsedEpochTime = StartTime
    Return
    }

--  send page PG to Compression Manager for compression
Call WriteCompPage(PG,GrowWS,Tag,fail)

If fail=True        --  Page was incompressible (compressed less
                        than threshold, e.g., 12.5%)
    {               --  Set VM Page Table Flags with special marker
                        so that MI,MD,MO = 1,0,1
    Page# = PG / PageSize
    VMPageMap(Page#).MD  =0  -- Reset Modified Flag
    VMPageMap(Page#).MO  =1  -- Set Mapped Out Flag
```

- 54 -

```
        }
    Else
        {
        -- Update VMPageMap for page written to MappedOut Storage
        Page# = PG / PageSize
        VMPageMap(Page#).Adr = Tag
        VMPageMap(Page#).MI = 0
        VMPageMap(Page#).MD = 0
        VMPageMap(Page#).MO = 1

-- Update Count of Uncompressed Pages in WorkSpace
        #UncompressedPages = #UncompressedPages - 1

Flag2 = True   --   Page at PG has been successfully swapped out
        }
    } -- end of Do Until Loop
-- Restore saved ElaspedEpochTime timer value
Set ElapsedEpochTime = StartTime
Return
```

- 55 -

TABLE 4

Procedure for Updating LRU Page Usage Data Table

```
      AgingEvent()

--   Simultaneously Update Page Usage Data and Rebuild Best128 List

--   Clear Best128 List
           BestAge = FFFF H
           #BestEntries = 0
           #PagesUsed = 0

--   Do Just One Pass through the VMPageMap
15         XP = StartSweepPtr
           StartSweepPtr = Ptr + 1 Modulo #VMPages
           For Page# = XP to #VMPages and then For Page# = 0 to XP-1
           {
               --   Ignore UnSwappable Pages, Pages in MappedOut Storage, and
20                  uninitialized non-resident pages
               If ( VMPageMap(Page#).NS = 0
                   .and. VMPage(Page#).MI,MD,MO ≠ 0,0,1
                   .and. VMPage(Page#).MI,MD,MO ≠ 0,0,0 )
                   {
                   --   Shift Usage Data into LRUtable
                   RAMPage# = VMPageMAP(Page#).Adr
                   RightShift VMPageMAP(Page#).U into LRUtable(RAMPage#)

--   Update WorkSpace Usage bits
                   VMPageMap(Page#).WSU = VMPageMap(Page#).WSU
                                              .or.  VMPageMap(Page#).U -- Count Number of Swappable Pages with WSU=1
                   If VMPageMap(Page#).WSU
                       { #PagesUsed = #PagesUsed + 1 }

--   Clear Used Bit Flag
                   VMPageMap(Page#).U = 0

                   --   Update Best128List
                   If ( LRUtable(RAMPage#) = BestAge  and  #BestEntries < 128 )
                       {
                       --   Add page to Best128List
                       Best128List(#BestEntries) = Page#
                       #BestEntries = #BestEntries + 1
                       }
                   If LRUtable(RAMPage#) < BestAge
                       {
```

- 56 -

```
                --  Clear Best128List and Restart with current Page#
                BestAge = LRUtable(RAMPage#)
                Best128List(0) = Page#
                #BestEntries = 1
              }
         }
    }    -- End of For Loop --  Update GrowWS Flag
    --  Note that #PagesUsed equals the number of Pages in VMPageMap with
        WSU = 1, excluding UnSwappable Pages (NS=1) and excluding Pages
        whose Page# > #VMPages 15      If #PagesUsed > #UncompressedPages
            { Set GrowWS = True }
        Else
            { Set GrowWS = False }

20      Return
```

- 57 -

TABLE 5

Procedure for Building Best128List - List of Best Pages to Swap Out

BuildBest128List()

-- Similar to AgingEvent() procedure, except that Page Usage Data is not updated -- Clear Best128 List
   BestAge = FFFF H
   #BestEntries = 0
   #PagesUsed = 0

15 -- Do Just One Pass through the VMPageMap
   XP = StartSweepPtr
   StartSweepPtr = Ptr + 1 Modulo #VMPages
   For Page# = XP to #VMPages and then For Page# = 0 to XP-1
   {
20    -- Ignore UnSwappable Pages, Pages in MappedOut Storage, and uninitialized non-resident pages
      If ( VMPageMap(Page#).NS = 0
           .and. VMPage(Page#).MI,MD,MO ≠ 0,0,1
           .and. VMPage(Page#).MI,MD,MO ≠ 0,0,0 )
25    {
      -- Update WorkSpace Usage bits
      VMPageMap(Page#).WSU = VMPageMap(Page#).WSU
                                        .or. VMPageMap(Page#).U 30    -- Count Number of Swappable Pages with WSU=1
      If VMPageMap(Page#).WSU
          { #PagesUsed = #PagesUsed + 1 }

-- Update Best128List
      If (VMPageMap(Page#).U = 0) --  Don't put pages currently in
                                      use into the Best128List
      {
      If ( LRUtable(Page#) = BestAge .and. #BestEntries < 128 )
          {
          -- Add page to Best128List
          Best128List(#BestEntries) = Page#
          #BestEntries = #BestEntries + 1
          }
      If LRUtable(Page#) < BestAge
          {
          -- Clear Best128List and Restart with current Page#
          BestAge = LRUtable(Page#)
          Best128List(0) = Page#

- 58 -

```
                    #BestEntries = 1
                    }
                }
            }
        }   -- End of For Loop -- Special Handling if All Pages are In Use
        If #BestEntries = 0
            { Call AgingEvent() }
        Else
         -- Update GrowWS Flag
         -- Note that #PagesUsed equals the number of Pages in VMPageMap with
            WSU = 1, excluding UnSwappable Pages (NS=1) and excluding Pages
            whose Page# > #VMPages
15          {
            If #PagesUsed > #UncompressedPages
                { Set GrowWS = True }
            Else
                { Set GrowWS = False }
            }
        Return
```

- 59 -

TABLE 6

Procedure For Handling Read Operation

```
        Read(first,last)
                -- An I/O Read from disk or elsewhere is filing all pages from first to last
                For Page# from first to last
                {
                -- Special Handling for pages in MappedOut Storage
                If VMPageMap(Page#).MI=0 and VMPageMap(Page#,MO)=1

{
                        --   Compression Manager releases space allocated to this page
                        Call ReleaseCompPage(Page#)
                        --   Set Up VMPageMap
                        Clear Flags MI and MO of VMPageMap(Page#)
                        Set Flag MD of VMPageMap(Page#) -- special marker
                        }
                If VMPageMap(Page#).MI = 1
                        {
                        -- keep as resident page, but do not bother to initialize
                        Clear Flags MD and MO of VMPageMap(Page#)
                        }
                }
                }    --  End of For Loop
                Call Standard OS Read() procedure
                Return
```

- 60 -

TABLE 7

Procedures For Handling Memory Range and Page Deallocations

```
      DeallocateMem(begin,end)    -- This is called when a program deallocates
                                      memory from addresses "begin" to "end"
      If (the address range "begin" to "end" includes any complete pages)
      {
          first = address of the first complete page in the specified address range
          last = address of the last complete page in the specified address range
          Call DeallocatePages(first,last)
      }
      Fill the deallocated portions of any partially deallocated pages with zeros
      Return

DeallocatePages(first,last)    -- This is called when a program terminates
                                        or deallocates pages no longer needed
      For Page# from first to last
      {
          -- Special Handling for pages in MappedOut Storage
          If VMPageMap(Page#).MI=0 and VMPageMap(Page#).MO=1
          {
              -- Compression Manager releases space allocated to this page
              Call ReleaseCompPage(Page#)
              -- Set Up VMPageMap
              Clear Flags MO, MD, U and WSU of VMPageMap(Page#)
          }

          If VMPageMap(Page#).MI = 1
          {
              -- Keep as resident page, but ...
              -- The Modified (MD) flag is cleared so that this deallocated logical
                  page will not be saved to MappedOut Storage
              Clear Flags MD, MO, U and WSU of VMPageMap(Page#)
              Call FillPage(page#)    -- Fill page with highly compressible data -- Set Usage History to 0000 H so that the RAM page can be
                  reused
              Clear LRUtable(Page#)
          }
      }    -- End of For Loop
      Return
```

- 61 -

Table 8

VM Manager Initialization

```
     Initialize()
         --  This procedure is called during standard OS boot sequence Extend the VMPageMap to include pages for addresses through 2xPhysMem
         and addresses 40000000 through 40000000 + 2xPhysMem
         Install VM Manager, VM Compression Manager, Compression Manager
         Tables Assign initial set of RAM pages to Compression Heap
         Assign all remaining RAM pages to the next logical addresses to be
         assigneed by the OS.
             --  In mutliprocessing implementations, the remaining RAM pages would
                 be added to the end of the Compression Heap, which acts as a RAM
                 page free list.

Initialize VMPageMap to indicate UnSwappable pages for VM Manager and
         Compression Manager and to initialize Used and WorkSpaceUsed flags
         Initialize Best128List
         Set GrowWS = False
         Set ElapsedEpochTime = 0
         Start ElapsedEpochTime timer 30       Return
```

- 62 -

Table 9

COMPRESSION MANAGER PROCEDURE
Get Free Page from Compression Heap

GetCompPage(PageAdr,fail)

- (A) Check Amount of Free Space in Heap
- If Free Space is < 2 Pages, Compression Manager cannot give a free page to the VM Manager.

If ( (FreeHeapBytes ≤ 2 x PageSize) .and. Not(SwapOutFlag) )
{
fail=True
Return
}

- If the total size of the Compression Heap is less than 3 pages, this means the VM Manager probably has unused pages of RAM mapped into unused virtual memory locations, and therefore a Fail signal is sent to the VM Manager, which will force it to find old unused pages to send to the Compression manager.

HeapSize = EndHeap - BeginHeap
If HeapSize < 3 x PageSize
{
fail=True
Return
}

- (B) If SwapOutFlag is True and Free Space < 2 pages, Generate Free Space by Moving Pages from Compression Heap to Secondary Memory.

If ( (FreeHeapBytes ≤ 2 x PageSize) .and. SwapOutFlag )
{
Do Until (FreeHeapBytes > 2 x PageSize)
{
Tag = MapChainStart Find SectorPtr to first sector in a sequence of free sectors sufficiently large to store page PG Copy Page associated with Tag from Compression Heap into Secondary Memory starting at sector specified by SectorPtr.

Add segments in which the moved Page was stored to set of Free Space segments, updating Free Space segment links and FirstFree pointer, as necessary. If any new Free Space segment is adjacent

- 63 - a pre-existing Free Space segment, merge the adjacent new and pre-existing Free Space segments.

-- Store Relevant Bookkeeping Data
Update SectorMap to indicate sectors occupied by swapped out page
MapChainStart = MapChain(Tag).ForwardPtr
MapChain(Tag) = SectorPtr
MainMap(Tag).Ptr = -1

FreeHeapBytes = FreeHeapBytes + MainMap(Tag).Size
                 + 6 x (Number of segments merged with Free
                 Space segments)
    }  -- End of Do Loop
}

-- (C) If Size of the Last Free Block is < 1 Page + 16 Bytes, move compressed data from near the end of the Compression Heap to the Free Space closest to the top of the Compression Heap until the Last Free Block is > 1 page
fail=False
Flag3 = False
Do Until (Flag3)
    {
    SizeLastFreeBlock = EndHeap - LastFree
    If SizeLastFreeBlock < PageSize + 16 Bytes
        { Call FillFromBottom() }  -- Move One Compressed Page
                                           toward front of Compression Heap
    Else
        { Flag3 = True}
}  -- End of Do Loop -- (D) Provide Free Page at end of Compression Heap to VM Manager
-- Compute 32-bit Logical Page Address of Free Page
PageAdr = EndHeap - PageSize -- Update EndHeap and FreeHeapBytes
EndHeap = EndHeap - PageSize
FreeHeapBytes = FreeHeapBytes - PageSize Return

- 64 -

TABLE 10

COMPRESSION MANAGER PROCEDURE

Fill Heap From Bottom Procedure

```
FillFromBottom()
    -- Find Last Page in Compression Heap
    LastTag = RAM(FirstFree - 2)
    HeapLocation = MainMap(LastTag).Ptr
    CompSize = MainMap(LastTag).Size -- Copy Last Page to Compression Buffer
    Copy entire Page from Compression Heap, starting at HeapLocation, into
    Compression Buffer.
```

Add segments in which the Last Page was stored to set of Free Space segments, updating Free Space segment links and FirstFree pointer, as necessary. For each new Free Space segment that is adjacent a pre-existing Free Space segment, merge the adjacent new and pre-existing Free Space segments.

```
    -- Update FreeHeapBytes
    FreeHeapBytes = FreeHeapBytes + CompSize +
                6 x (Number of segments merged with Free Space segments)

-- Copy Last Page to Top of Free Space
```
Copy Page in Compression Buffer into Free Space (starting at First Free Space segment) of Compression Heap (starting at First Free Space segment), updating FirstFree and Free Space segment links to maintain a doubly linked list of Free Space segments in the compression heap.

Update MainMap, if necessary, to indicate new Compression Heap location of the page that was moved to the top of the Free Space.

```
    -- Update FreeHeapBytes
    FreeHeapBytes = FreeHeapBytes - CompSize
    If  (the Free Space segment into which the end of the Page was copied
         was split into a data segment and a Free Space segment)
        { FreeHeapBytes = FreeHeapBytes - 6 }
```

Update LastFree to point to beginning of last Free Space Segment

Return

Table 11

COMPRESSION MANAGER PROCEDURE

Write Page into MappedOut Storage Space

```
WriteCompPage(PG,GrowWS,Tag,fail)

--  Update Compression Manager's SwapOut Flag
        (for use by GetCompPage procedure)
    SwapOutFlag = GrowWS
    fail = False --  Call Compression Procedure
    Call Compress(PG,CompSize)

--  Fail if SwapOutFlag is False and page is incompressible
    If (CompSize > Threshold  -- e.g., 87.5% of PageSize, or 3584 Bytes
        .and. Not(SwapOutFlag))
        {
        fail = True     -- Tell the VM Manager that page is incompressible
        Return
        }

--  Store CompSize in Main Map and then Update FreeMapEntry
    Tag = FreeMapEntry
    MainMap(Tag).Size = CompSize
    FreeMapEntry = smallest TagValue for which MainMap(TagValue).Size=0

--  Store Incompressible Page In Secondary Memory
    --  Check to see if Page at PG should be swapped out to secondary memory
    If ( GrowWS .and. (FreeHeapBytes ≤ 2 x PageSize)
        .and. CompSize > Threshold )
        {
        Find SectorPtr to first sector in a sequence of free sectors sufficiently
        large to store page at PG Store Uncompressed Page from page at PG into Secondary Memory
        starting at sector specified by SectorPtr.
        CompSize = PageSize -- Store Relevant Bookkeeping Data in MainMap and MapChain
        MainMap(Tag).Size = PageSize
        MainMap(Tag).Ptr  = -1       -- indicates page is in
        MapChain(Tag) = SectorPtr    -- Secondary Memory Address
```

- 66 -

```
-- Add Page at PG to end of Compression Heap
Page# = PG / PageSize
VMPageMap(NextCompHeapPage).Adr = VMPageMap(Page#).Adr
VMPageMap(NextCompHeapPage).MI = 1
VMPageMap(NextCompHeapPage).MO = 0
-- Leave Modified (MD) flag unchanged -- Update FreeHeapBytes and NextCompHeapPage
FreeHeapBytes =   FreeHeapBytes + PageSize
NextCompHeapPage = NextCompHeapPage + 1
Return
}

-- Store Page In Compression Heap
If CompSize ≤ Threshold    -- e.g., 87.5% of PageSize, or 3584 Bytes
    {
    If CompSize = -1   --   -1 indicates page filled with identical words
        -- Special Handling for Page filled with identical words.
        -- Word Value is stored in MainMap(Tag).Ptr instead of in the
           Compression Heap
        { MainMap(Tag).Ptr = RAM(PG) }
    Else
        {
        Copy Compressed Page in Compression Buffer into Free Space of
        Compression Heap, updating FirstFree and Free Space segment
        links as necessary
        }
    }
Else          -- Store Page in Uncompressed Format into Compression Heap
    {
    Copy Uncompressed Page from page at PG into Free Space of
    Compression Heap, updating FirstFree and Free Space segment links
    as necessary
    CompSize = PageSize
    MainMap(Tag).Size = PageSize
    }

-- Store Relevant Bookkeeping Data in MainMap and MapChain
MainMap(Tag).Ptr   =   Pointer to end of the first data segment in which the
                       compressed page was stored.

-- Add compressed page to Map Chain, unless compression ratio ≥ 4
If CompSize > 0.25 x PageSize
    {
    MapChain(Tag).BackPtr     = MapChainEnd
    MapChain(Tag).ForwardPtr = 0     -- Tag = 0 is invalid value
    MapChain(MapChainEnd).ForwardPtr = Tag
    MapChainEnd = Tag
```

- 67 -

```
            }

-- Add Page PG to end of Compression Heap
            Page# = PG / PageSize
 5          VMPageMap(NextCompHeapPage).Adr = VMPageMap(Page#).Adr
            VMPageMap(NextCompHeapPage).MI = 1
            VMPageMap(NextCompHeapPage).MO = 0
            -- Leave Modified (MD) flag unchanged
            --   Update FreeHeapBytes
            If CompSize = -1
                { FreeHeapBytes = FreeHeapBytes + PageSize }
            Else
                {
                FreeHeapBytes =   FreeHeapBytes + PageSize - CompSize
                If   (the Free Space segment into which the end of the Page was copied
                        was split into a data segment and a Free Space segment)
                        { FreeHeapBytes = FreeHeapBytes - 6 }
                }
20
            Return
```

- 68 -

Table 12

COMPRESSION MANAGER PROCEDURE

Retrieve and Decompress Page from MappedOut Storage

```
     ReadCompPage(Tag)
        -- Locate the Page In Compression Heap or Secondary Memory
        HeapLocation  = MainMap(Tag).Ptr
        CompSize      = MainMap(Tag).Size
        If HeapLocation = -1
            { SectorPtr = MapChain(tag) }

        -- Special Handling for Page filled with identical words.
        If CompSize= -1    --  -1 indicates page filled with identical words
        -- Word Value is stored in MainMap(Tag).Ptr instead of Heap Location
            {
            Word = MainMap(Tag).Ptr
            Fill Page at TransientPageAdr with Word
            Return
            }

-- If page not compressed, copy Page into RAM starting at the Logical
           Address corresponding to Page#
        If CompSize = PageSize
            {
            If HeapLocation = -1
                {
                Copy Uncompressed Page from Secondary Memory, starting at
                sector specified by SectorPtr, into page at TransientPageAdr
                }
            Else   -- Uncompressed page is in Compression Heap
                {
                Copy Uncompressed Page from Compression Heap, starting at
                HeapLocation, into page at TransientPageAdr
                }
            }

        Else
            -- If Page is compressed, copy compressed Page data into
               Compression Buffer, then decompress the page and write the
               decompressed data into RAM starting at the Logical Address
               corresponding to Page#
            {

If HeapLocation = -1
                {
```

- 69 -

```
                Copy Compressed Page from Secondary Memory, starting at sector
                specified by SectorPtr, into Compression Buffer.
            }
        Else    -- Page is in Compression Heap
            {
            Copy Compressed Page from Compression Heap, starting at
            HeapLocation, into Compression Buffer.

-- Decompress page in Compression Buffer and store decompressed
               page at TransientPageAdr
        Call Decompress(CompSize)
        }

Return
```

Table 13

Release Page in MappedOut Storage

-- Compression Manager releases space allocated to this page
ReleaseCompPage(Page#)

-- Locate the Page In Compression Heap or Secondary Memory
Tag = VMPageMap(Page#).Adr
HeapLocation = MainMap(Tag).Ptr
CompSize = MainMap(Tag).Size
If HeapLocation = -1
     { SectorPtr = MapChain(tag) }

      -- If page is in Secondary Memory, release the sectors assigned to this page
If HeapLocation = -1
     {
     Update SectorTable to show as unused those sectors in which Page
      was stored.
     MapChain(tag) = 0 -- Clear Disk Address in MapChain
     }
Elseif Compsize ≠ -1    -- If page is in Compression Heap, add all segments for this page to the Free Space of Compression Heap, updating Free Space segment links as necessary

{
     Add segments in which page was stored to set of Free Space segments,
     updating Free Space segment links as necessary. If any new Free
      Space segment is adjacent a pre-existing Free Space segment, merge
     the adjacent new and pre-existing Free Space segments.

-- Update FreeHeapBytes
     FreeHeapBytes = FreeHeapBytes + CompSize
                              + 6 x (Number of segments merged with Free
                                  Space segments)
     If CompSize > 0.25 x PageSize
        { Call RemoveFromMapChain(Tag) }
     }
     -- Update Bookkeeping Entries in MainMap
     MainMap(Tag).Ptr = 0
     MainMap(Tag).Size = 0
     FreeMapEntry = smallest TagValue (>0) for which
                              MainMap(TagValue).Size = 0

Return

Table 14

Procedure for Removing a Tag from the MapChain

```
     RemoveFromMapChain(Tag)

-- Special Handling if this is first entry in MapChain
         If (MapChainStart = Tag)
            {
            If (MapChainEnd = Tag)    -- Is this only Item in MapChain?
               {
               MapChainStart = 0
               MapChainEnd = 0
               }
            Else
               { MapChainStart = MapChain(Tag).ForwardPtr }
            }

-- Special Handling if this is last entry in MapChain
         If (MapChainEnd = Tag)
            { MapChainEnd = MapChain(Tag).BackPtr }

-- Relink MapChain entries before and after released page, unless page
            was in Secondary Memory
         If ( Tag ≠ MapChainStart .and. Tag ≠ MapChainEnd
            .and. MainMap(Tag).Ptr ≠ -1 )
            {
            Temp1 = MapChain(Tag).BackPtr
            Temp2 = MapChain(Tag).ForwardPtr
            MapChain(Temp1).ForwardPtr = Temp2
            MapChain(Temp2).BackPtr = Temp1
            }
         Return
```

- 72 -

Table 15

Compression Procedure

```
     Compress(Page#,CompSize)
         -- Initialize Dictionary Table LastUse
         Base = Page# x PageSize
         Word = RAM(Base)
         LastUse(Word) = -1
         Flag4 = True For Position = 1 to PageSize - 2      -- positions are byte positions
             {
             PriorWord = Word
             Word = RAM(Base + Position)
             If Word ≠ PriorWord
                 { Flag4 = False }
             Else
                 { LastUse(Word) = -1 }
             }

-- Special Handling for Page filled with identical words.
         If Flag4 = True
             {
             CompSize = -1
             Return
             }

-- Process first Word  (which will be first word in the Dictionary)
         Word = RAM(Base)
         LastUse(Word) = 0
         IndexTable(0).Index = 0
         IndexTable(0).PriorPos = -1
         NextIndex = 1
         Write to CompressBuffer "0"+Word
         CompSize = 17 (bits)

-- Process Page in units of 2-Byte words
         Position = 2
         Do Until Position ≥ PageSize - 2
             {
             Word = RAM(Base + Position)

-- Is this first time Word has been Seen?
             If LastUse(Word) = -1
                 {
                 -- Processing for Word Not Already in the Dictionary
                 LastUse(Word) = Position
```

- 73 -

```
IndexTable(Position/2).Index = NextIndex
IndexTable(Position/2).PriorPos = -1
NextIndex = NextIndex + 1

--  Special Handling for Audio Data and the like:
Dif = Word - RAM(Base + Position - 4)
If ( (Position > 2) .and. (|Dif| < 1024) )
    {
    Write to CompressBuffer "110"+
            Dif(encoded as 11-bit signed value)
    CompSize = CompSize + 14
    }
Else
    {
    Write to CompressBuffer "0"+Word
    CompSize = CompSize + 17
    }
Position = Position + 2
}
Else
{
--  Processing for Word Already in the Dictionary
PriorPos = LastUse(Word)
IndexTable(Position/2).PriorPos = PriorPos
IndexTable(Position/2).Index = IndexTable(PriorPos/2).Index
LastUse(Word) = Position BestPriorPos = PriorPos
BestRun = 1
#Tries = 0

Do Until ( (BestRun = 32) .or. (PriorPos=-1) .or. (#Tries=32) )
    {
    #Tries = #Tries + 1
    RunLength =   Number of words in Page, starting at PriorPos,
                  which match words starting at the current
                  Position, not to exceed 32)
    If RunLength > BestRun
        {
        BestRun = RunLength
        BestPriorPos = PriorPos
        }
    PriorPos = IndexTable(PriorPos/2).PriorPos
    }  --  End of Do Loop If BestRun = 1     --  Best match = 1 word long:
    {
    DIndex = IndexTable(Position/2).Index
```

- 74 -

```
        N = 1 + IntegerPortion( Log₂(NextIndex) )
        Boundary = 2ᴺ - NextIndex
        If DIndex ≥ Boundary
            { EIndex = (DIndex + Boundary) encoded as N bits }
        Else
        {
            N = N - 1
            EIndex = DIndex encoded as N bits
        }
        Write to CompressBuffer "10"+ EIndex
        CompSize = CompSize + 2 + N
        Position = Position + 2
    }
Else    —  Encoding Procedure for best match is > 1 word long:
    {
    Update LastUse and IndexTable entries
    for words at Position+2 through Position+(2x(BestRun-1))

BeginCase (BestRun)
        Case (BestRun=2)
            { E.Length = "0" }
        Case (BestRun=3)
            { E.Length = "10" }
        Case (BestRun=4)
            { E.Length = "110" }
        Case (BestRun > 4)
        {
            Value = BestRun - 2
            E.Length = "111" + Encode(Value,5 bits,unsigned)
        }
    EndCase DistBack = Position - BestPriorPos
    BeginCase (DistBack)
        Case (DistBack ≤ 16)
        {
            E.Distnc = "00" + Encode(DistBack-1, 4 bits, unsigned)
        }
        Case (16 < DistBack ≤ 80)
        {
            E.Distnc = "01" + Encode(DistBack -17, 6 bits, unsigned)
        }
        Case (80 < DistBack)
        {
            E.Distnc = "1" + Encode(DistBack, 11 bits, unsigned)
        }
    EndCase
```

- 75 -

```
                Write to CompressBuffer "111"+ E.Length + E.Distnc
                CompSize = CompSize + 3 + (bit length of E.Lenth and E.Distnc)

Position = Position + (BestRun x 2)
              }
        }
      }   -- End of Main Loop
      -- Convert CompSize to number of bytes writen to CompressBuffer
      CompSize = RoundUp( Compsize / 8 )
      Return
```

- 76 -

Table 16

Decompression Procedure

```
Decompress(CompSize) --  Decompress page in Compression Buffer and store
                         decompressed page in the Transient Page at
                         TransientPageAdr -- IndexTable is not used during Decompression
       -- LastUse table does not need to be initialized
       -- LastUse table is used as a Dictionary during Decompression Base = TransientPageAdr
       BitPos = PtrCompBuffer
       NextIndex = 0

-- Process first Word (which will be first word in the Dictionary)
       Word = RAM(Base + 1, 16 bits)
       BitPos = BitPos + 17
       LastUse(Word) = 0

RAM(Base) = Word              -- Write First Word to Output Page
       LastUse(NextIndex) = Word     -- Write First Word to Dictionary Position = 2
       NextIndex = 1

-- Process Page in units of 2-Byte words
       Do Until Position ≥ PageSize
       {
              -- Processing for Word Not Already in the Dictionary
              If RAM(BitPosition, 1 Bit) = "0"
              {
              Word = RAM(BitPosition+1, 16 bits)

RAM(Base+Position) = Word    -- Write Word to Output Page
              LastUse(NextIndex) = Word    -- Write Word to Dictionary
              NextIndex = NextIndex + 1

Position = Position + 2
              BitPosition = BitPosition + 17
              }

-- Special Handling for Audio Data and the like:
              ElseIf RAM(BitPosition, 3 Bits) = "110"
              {
```

- 77 -

```
                    Dif = RAM(BitPosition + 3, 11 bits)
                    Dif = Dif with 10th bit replicated in bits 12 through 15
                    Word = RAM(Position - 4) + Dif
                   RAM(Base+Position) = Word    -- Write Word to Output Page
                    LastUse(NextIndex) = Word    -- Write Word to Dictionary
                    NextIndex = NextIndex + 1

Position = Position + 2
                    BitPosition = BitPosition + 14
                    }

-- Processing for Single Word Already in the Dictionary
                ElseIf RAM(BitPosition, 2 Bits) = "10"
                    {
                    -- Check for very small Dictionary
                    If NextIndex ≤ 2
                        { Index = RAM(BitPosition+2, 1 Bit) }
                    Else
                        {
                        N = IntegerPortion( Log₂(NextIndex) ) + 1
                        Boundary = 2ᴺ - NextIndex
                        Index = RAM(BitPosition+2, N-1 Bits)
                        If Index ≥ Boundary
                            { Index = = RAM(BitPosition+2, N Bits) - Boundary }
                        Else
                            { N = N - 1 }
                        }

                    Word = LastUse(Index)        -- Get Word from Dictionary
                    RAM(Base+Position) = Word    -- Write Word to Output Page Position = Position + 2
                    BitPosition = BitPosition + 2 + N
                    }

-- Processing for MultiWord Repeat of Data Earlier in Page
                ElseIf RAM(BitPosition, 3 Bits) = "111"
                    {
                    -- Determine Run Length (Number of Contiguous Words Repeated)
                    If RAM(BitPosition+3, 1 Bit) = "0"
                        {
                        Length = 2
                        BitPosition = BitPosition + 4
                        }
                    ElseIf RAM(BitPosition+3, 2 Bits) = "10"
                        {
                        Length = 3
```

- 78 -

```
            BitPosition = BitPosition + 5
        }
        ElseIf RAM(BitPosition+3, 3 Bits) = "110"
        {
            Length = 4
            BitPosition = BitPosition + 6
        }
        ElseIf RAM(BitPosition+3, 3 Bits) = "111"
        {
            Length = 2 + RAM(BitPosition+3, 5 bits)
            BitPosition = BitPosition + 11
        }

-- Determine Distance Back of First Repeated Word
        If RAM(BitPosition, 2 Bits) = "00"
        {
            DistBack = 1 + RAM(BitPosition+2, 4 bits)
            BitPosition = BitPosition + 6
        }
        ElseIf RAM(BitPosition, 2 Bits) = "01"
        {
            DistBack = 17 + RAM(BitPosition+2, 6 bits)
            BitPosition = BitPosition + 8
        }
        ElseIf RAM(BitPosition, 1 Bit) = "1"
        {
            DistBack = RAM(BitPosition+1, 11 bits)
            BitPosition = BitPosition + 12
        }

-- Copy Repeated Data to New Position
        Source = Base + Position - (2 x DistBack)
        Dest   = Base + Position
        Copy from RAM(at: Source, through: Source + (2 x Length) - 1)
             to RAM(at: Dest, through: Dest + (2 x Length) - 1)

Position = Position + (Length x 2)

}   -- End of Processing for MultiWord Repeat of Earlier Data
}       -- End of Main Loop
Return
```

What is claimed is:

1. A data compression method for compressing data stored in a computer memory, the steps of the method comprising:

(A) providing a set of M data words in said computer memory to be compressed, each of said data words containing N bits;

(B) providing a first table for storing, during processing of said M data words, data representing last occurrence positions among those of said M data words already processed for all distinct word values among those of said M data words already processed;

(C) providing a second table for storing, during processing of said M data words, for each said data word an entry indicating the position among said M data words, if any, of a most recent prior occurrence of another data word with the same word value as said each data word;

(D) providing a dictionary index for denoting, during processing of said M data words, how many distinct data word values are encountered during processing of said M data words;

(E) processing said M data words in sequential order, including processing each said data word by performing the steps of:

(E1) determining, by referencing said first table, whether at least one data word with the same word value as said each data word is located earlier in said M data words than said each data word and determining the last occurrence position of any such data word;

(E2) when said determination in step E1 is that said each data word's value is unequal to that of all data words located earlier in said M data words than said each data word,. storing in said first table an entry corresponding to said each data word's value position data representing said each data word's position among said M data words, storing in said second table in an entry corresponding to said each data word's position said dictionary index and an indicator that said data word's value does not occur earlier among said M data words, incrementing said dictionary index, and outputting a code representing said each data word's value;

(E3) when said determination in step E1 is that said each data word's values equal to at least one earlier word in said M data words, referencing said second table to identify data words earlier in said M data words than said each data word that match said each data word's value, identifying a longest sequence of data words earlier in said M data words than said data word which match an equal number of data words starting with said each data word, (E3A) when said longest sequence's length is greater than one data word, outputting a run length code that indicates said longest sequence's length and position, and updating said first and second tables for said equal number of data words starting with said each data word; and (E3B) when said longest sequence's length is equal to one data word, outputting a code that indicates the position of said identified longest sequence, and updating said first and second tables for said each data word.

2. The data compression method of claim 1, further including:

after steps (A) and (B) and prior to step (E), preprocessing said M data words by initializing an entry in said first table corresponding to each of said M data words' values, detecting if all of said M data words are identical in value, and when all of said M data words are identical in value, outputting a first predefined code indicating that all of said M data words are identical in value and skipping said step (E).

3. The data compression method of claim 1, said step E2 further including determining whether said each data word's value, which is unequal to that of all data words located earlier in said M data words than said each data word, is within a predefined range of the value of another data word positioned a predefined number of data words earlier in said M data words than said each data word, and when said determination is positive, outputting a differential code that indicates a value equal to the difference between said each data word's value and the value of said other data word.

4. The data compression method of claim 1, said step E3A including outputting a code that identifies said each data word's value with an index having N-1 bits, where N is equal to 1 plus the integer portion of the logarithm, base 2, of said dictionary index, when said each data word's dictionary index is less than $2^N$—NextIndex, wherein NextIndex corresponds to said dictionary index's value, and otherwise outputting a code including an index of N bits.

5. A data compression method for compressing a set of M data words stored in a computer memory, each of said data words containing N bits; the steps of the method comprising:

(B) providing a first table for storing, during processing of said M data words, data representing last occurrence positions among those of said M data words already processed for all distinct word values among those of said M data words already processed;

(C) providing a second table for storing, during processing of said M data words, for each said data word an entry indicating the position among said M data words, if any, of a most recent prior occurrence of another data word with the same word value as said each data word;

(D) providing a dictionary index for denoting, during processing of said M data words, how many distinct data word values are encountered during processing of said M data words;.

(E) processing said M data words in sequential order, including processing each said data word by performing the steps of:

(E1) determining, by referencing said first table, whether at least one data word with the same word value as said each data word is located earlier in said M data words than said each data word and determining the last occurrence position of any such data word;

(E2) when said determination in step E1 is that said each data word's value is unequal to that of all data words located earlier in said M data words than said each data word, storing in said first table in an entry corresponding to said each data word's value position data representing said each data word's position among said M data words, storing in said second table in an entry corresponding to said each data word's position said dictionary index and an indicator that said data word's value does not occur earlier among said M data words, incrementing said dictionary index, and outputting a code representing said each data word's value;

(E3) when said determination in step E1 is that said each data word's value is equal to at least one earlier word in said M data words, referencing said second table to identify data words earlier in said M data words than said each data word that match said each data worm's value, identifying a longest sequence of data words earlier in said M data words than said data word which match an equal number of data words starting with said each data word, outputting a corresponding code that indicates said longest sequence's length and position, and updating said first and second tables for said equal number of data words starting with said each data word.

6. The data compression method of claim 5, further including:

after step (B) and prior to step (E), preprocessing said M data words by initializing an entry in said first table corresponding to each of said M data words' values, detecting if all of said M data words are identical in value, and when all of said M data words are identical in value, outputting a first predefined code indicating that all of said M data words are identical in value and skipping said step (E).

7. The data compression method of claim 5, said step E2 further including determining whether said each data word's value, which is unequal to that of all data words located earlier in said M data words than said each data word, is within a predefined range of the value of another data word positioned a predefined number of data words earlier in said M data words than said each data word, and when said determination is positive, outputting a differential code that indicates a value equal to the difference between said each data word's value and the value of said other data word.

8. The data compression method of claim 5, said step E3 including outputting a code that identifies said each data word's value with an index having N-1 bits, where N is equal to 1 plus the integer portion of the logarithm, base 2, of said dictionary index, when said each data word's dictionary index is less than $2^N$—NextIndex, wherein NextIndex corresponds to said dictionary index's value, and otherwise outputting a code including an index of N bits.

9. A data compression subsystem for a computer having a central processing unit (CPU), and primary physical memory; said data compression subsystem comprising:

a first portion of said primary physical memory for storing data to be compressed; said data to be compressed comprising a sequence of M data words, each of said data words containing N bits;

a second portion of said primary physical memory for storing compressed data;

a first table having $2^N$ distinct entries; each of said $2^N$ distinct entries in said first table corresponding to a distinct one of $2^N$ possible values of each said data word containing N bits; said first table for storing, during processing of said M data words, data representing last occurrence positions among those of said M data words already processed for all distinct word values among those of said M data words already processed;

a second table having at least M distinct entries and a dictionary index; said second table for storing, during processing of said M data words, for each said data word an entry indicating the position among said M data words, if any, of a word value as said each data word;

first pass means for reading each of said M data words and initializing an entry in said first table corresponding to said each data word's value, for detecting if all of said M data words are identical in value, and for outputting a first predefined code when all of said M data words are identical in value;

second pass means for processing said M data words in sequential order, including means for processing each data word by (A) when said data word's value is unequal to all words in said M data words previously processed, storing in said first table in an entry corresponding to said each data word's value position data representing said each data word's position among said M data words, storing in said second table in an entry corresponding to said each data word's position said dictionary index and an indicator that said data word's value does not occur earlier among said M data words, incrementing said dictionary index, and outputting to said second portion of said primary physical memory a code representing said each data word's value; and (B) when said data word's value is equal to at least one word in said M data words previously processed, identifying a longest sequence of data words starting with said each data word, referencing said second table to identify data words earlier in said M data words than said each data word that match said each data word's value, identifying a longest sequence of data words earlier in said M data words than said data word which match an equal number of data words starting with said each data word, (B1) when said longest sequence's length is greater than one data word, outputting a run length code that indicates said longest sequence's length and position, and updating said first and second tables for said equal number of data words starting with said each data word, and (B2) when said longest sequence's length is equal to one data word, outputting a code that indicates the position of said identified longest sequence, and updating said first and second tables for said data word.

10. A data compression subsystem for a computer having a central processing unit (CPU), and primary physical memory; said data compression subsystem comprising:

a first portion of said primary physical memory for storing data to be compressed; said data to be compressed comprising a sequence of M data words, each of said data words containing N bits;

a second portion of said primary physical memory for storing compressed data;

a first table having $2^N$ distinct entries; each of said $2^N$ distinct entries in said first table corresponding to a distinct. one of $2^N$ possible values of each said data word containing N bits; said first table for storing, during processing of said M data words, data representing last occurrence positions among those of said M data words already processed for all distinct word values among those of said M data words already processed;

a second table having at least M distinct entries and a dictionary index; said second table for storing, during processing of said M data words, for each said data word an entry indicating the position among said M data words, if any, of a most recent prior occurrence of another data word with the same word value as said each data word;

means for processing said M data words in sequential order, including means for processing each data word by (A) when said data word's value is unequal to all words in said M data words previously processed, storing in said first table in an entry corresponding to said each data word's value position data representing said each data word's position among said M data words, storing in said second table in an entry corresponding to said each data word's position said dictionary index and an indicator that said data word's value does not occur earlier among said M data words, incrementing said dictionary index, and outputting to said second portion of said primary physical memory a code representing said each data word's value; and (B) when said data word's value is equal to at least one word in said M data words previously processed, identifying a longest sequence of data words starting with said each data word, referencing said second table to identify data words earlier in said M data words than said each data word that match said each data word's value, identifying a longest sequence of data words earlier in said M data words than said data word which match an equal number of data words starting with said each data word, (B1) when said longest sequence's length is greater than one data word, outputting a run length code that indicates said longest sequence's length and position, and updating said first and second tables for said equal number of data words starting with said each data word, and (B2) when said longest sequence's length is equal to one data word, outputting a code that indicates the position of said identified longest sequence, and updating said first and second tables for said data word.

11. The data compression subsystem of claim 10, further including:

first pass means for preprocessing said M data words so as to detect if all of said M data words are identical in value, and when all of said M data words are identical in value, outputting a first predefined code indicating that all of said M data words are identical in value.

12. The data compression subsystem of claim 10, said processing means further including means for determining whether said each data word's value, which is unequal to that of all data words located earlier in said M data words than said each data word, is within a predefined range of the value of another data word positioned a predefined number of data words earlier in said M data words than said each data word, and when said determination is positive, outputting a differential code that indicates a value equal to the difference between said each data word's value and the value of said other data word.

13. The data compression subsystem of claim 10, said processing means including means for outputting a code that identifies said each data word's value with an index having N-1 bits, where N is equal to 1 plus the integer portion of the logarithm, base 2, of said dictionary index, when said each data word's dictionary index is less than $2^N$—NextIndex, wherein NextIndex corresponds tLo said dictionary index's value, and otherwise outputting a code including an index of N bits.

* * * * *